United States Patent
Cheng et al.

(10) Patent No.: US 12,512,408 B2
(45) Date of Patent: Dec. 30, 2025

(54) SEMICONDUCTOR DEVICES INCLUDING BACKSIDE POWER VIA AND METHODS OF FORMING THE SAME

(71) Applicant: Taiwan Semiconductor Manufacturing Co., Ltd., Hsinchu (TW)

(72) Inventors: Po-Hsien Cheng, Hsinchu (TW); Zhen-Cheng Wu, Hsinchu (TW); Tze-Liang Lee, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 716 days.

(21) Appl. No.: 17/819,679

(22) Filed: Aug. 15, 2022

(65) Prior Publication Data

US 2023/0387012 A1    Nov. 30, 2023

Related U.S. Application Data

(60) Provisional application No. 63/365,352, filed on May 26, 2022.

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76805* (2013.01); *H01L 21/76831* (2013.01);
(Continued)

(58) Field of Classification Search
CPC ........... H10D 30/6757; H10D 30/6735; H10D 62/119; H01L 23/5286; H01L 23/5226;
(Continued)

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

CN   113809007 A  * 12/2021 ....... H01L 21/76805
KR   20040017038 A   2/2004
(Continued)

OTHER PUBLICATIONS

English translation of CN 113809007 (Year: 2021).*
(Continued)

*Primary Examiner* — Igwe U Anya
(74) *Attorney, Agent, or Firm* — Slater Matsil, LLP

(57) ABSTRACT

Methods of forming vias for coupling source/drain regions to backside interconnect structures in semiconductor devices and semiconductor devices including the same are disclosed. In an embodiment, a semiconductor device includes a conductive feature adjacent a gate structure; a dielectric layer on the conductive feature and the gate structure; a metal via embedded in the dielectric layer; and a liner layer between and in contact with the metal via and the dielectric layer, the liner layer being boron nitride.

20 Claims, 49 Drawing Sheets

(51) Int. Cl.
*H01L 23/522* (2006.01)
*H01L 23/532* (2006.01)
*H10D 30/67* (2025.01)
*H10D 62/10* (2025.01)

(52) U.S. Cl.
CPC .. *H01L 21/76843* (2013.01); *H01L 21/76877* (2013.01); *H01L 21/76897* (2013.01); *H01L 23/5226* (2013.01); *H01L 23/53238* (2013.01); *H10D 30/6735* (2025.01); *H10D 30/6757* (2025.01); *H10D 62/119* (2025.01)

(58) Field of Classification Search
CPC ......... H01L 23/53238; H01L 21/76805; H01L 21/76831; H01L 21/76843; H01L 21/76877; H01L 21/76897
USPC ........................................................ 257/401
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,700,017 B2 | 6/2020 | Leobandung | |
| 10,964,792 B1 | 3/2021 | Cheng et al. | |
| 2004/0038517 A1* | 2/2004 | Kang | H01L 21/76802 438/630 |
| 2015/0236115 A1* | 8/2015 | Chan | H10D 30/024 257/288 |
| 2018/0337256 A1* | 11/2018 | Anderson | H10D 30/025 |
| 2019/0043959 A1 | 2/2019 | Lee et al. | |
| 2020/0343138 A1* | 10/2020 | Jisong | H10D 64/017 |
| 2021/0098366 A1 | 4/2021 | Chang et al. | |
| 2021/0118731 A1 | 4/2021 | Chuang et al. | |
| 2021/0398898 A1* | 12/2021 | Yang | H01L 21/76885 |
| 2022/0320081 A1* | 10/2022 | Huang | H01L 21/02274 |
| 2023/0369201 A1* | 11/2023 | Cheng | H01L 21/76877 |

FOREIGN PATENT DOCUMENTS

| | | |
|---|---|---|
| KR | 20190013342 A | 2/2019 |
| KR | 20210038824 A | 4/2021 |
| TW | 202118053 A | 5/2021 |
| TW | 202121544 A | 6/2021 |

OTHER PUBLICATIONS

M. Ahmed et al., "Diffusion Barrier Prediction of Graphene and Boron Nitride for Copper Interconnects by Deep Learning" IEEE Access, vol. 8, 2020, 8 pages.

* cited by examiner

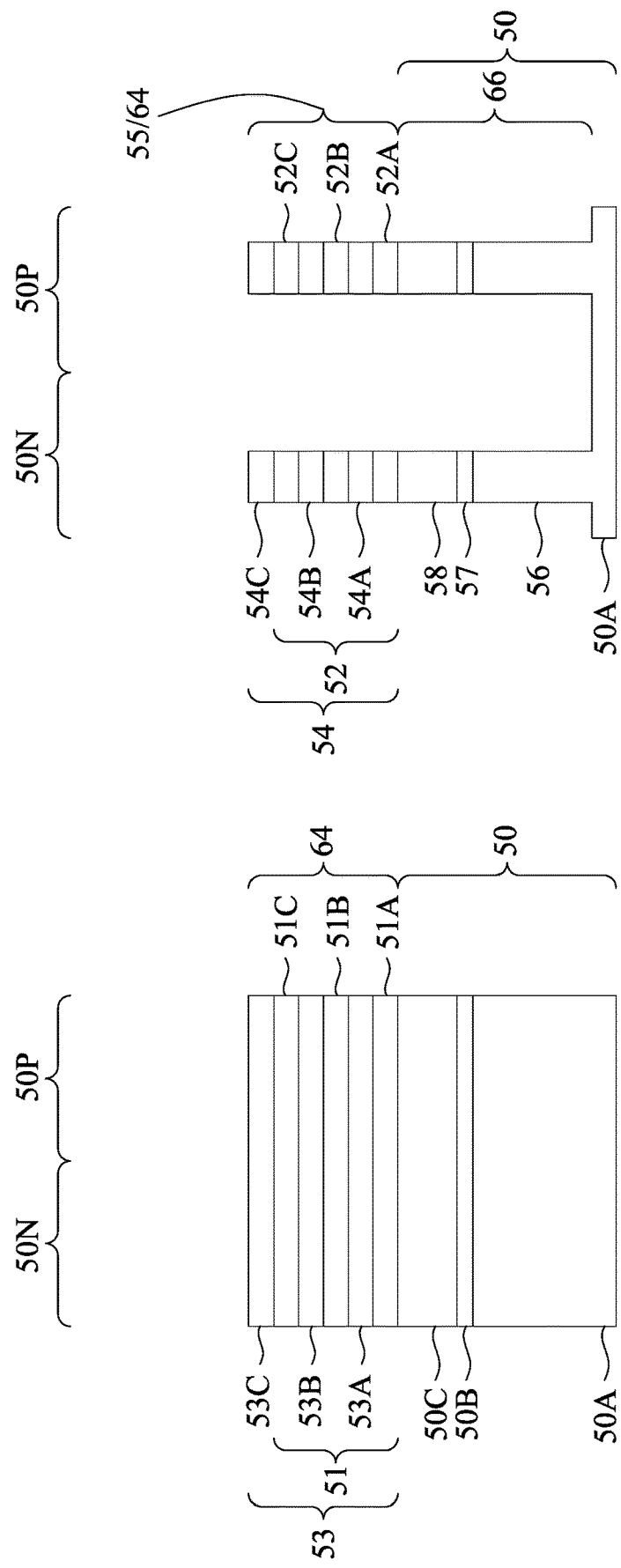

SEMICONDUCTOR DEVICES INCLUDING BACKSIDE POWER VIA AND METHODS OF FORMING THE SAME

PRIORITY CLAIM AND CROSS-REFERENCE

This application claims the benefit of U.S. Provisional Application No. 63/365,352, filed on May 26, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 20D, 21A, 21B, 21C, 22A, 22B, 22C, 23A, 23B, 23C, 24A, 24B, 24C, 25A, 25B, 25C, 26A, 26B, 26C, 27A, 27B, and 27C are cross-sectional and top-down views of intermediate stages in the manufacturing of nanostructure FETs, in accordance with some embodiments.

DETAILED DESCRIPTION

Figure 1:
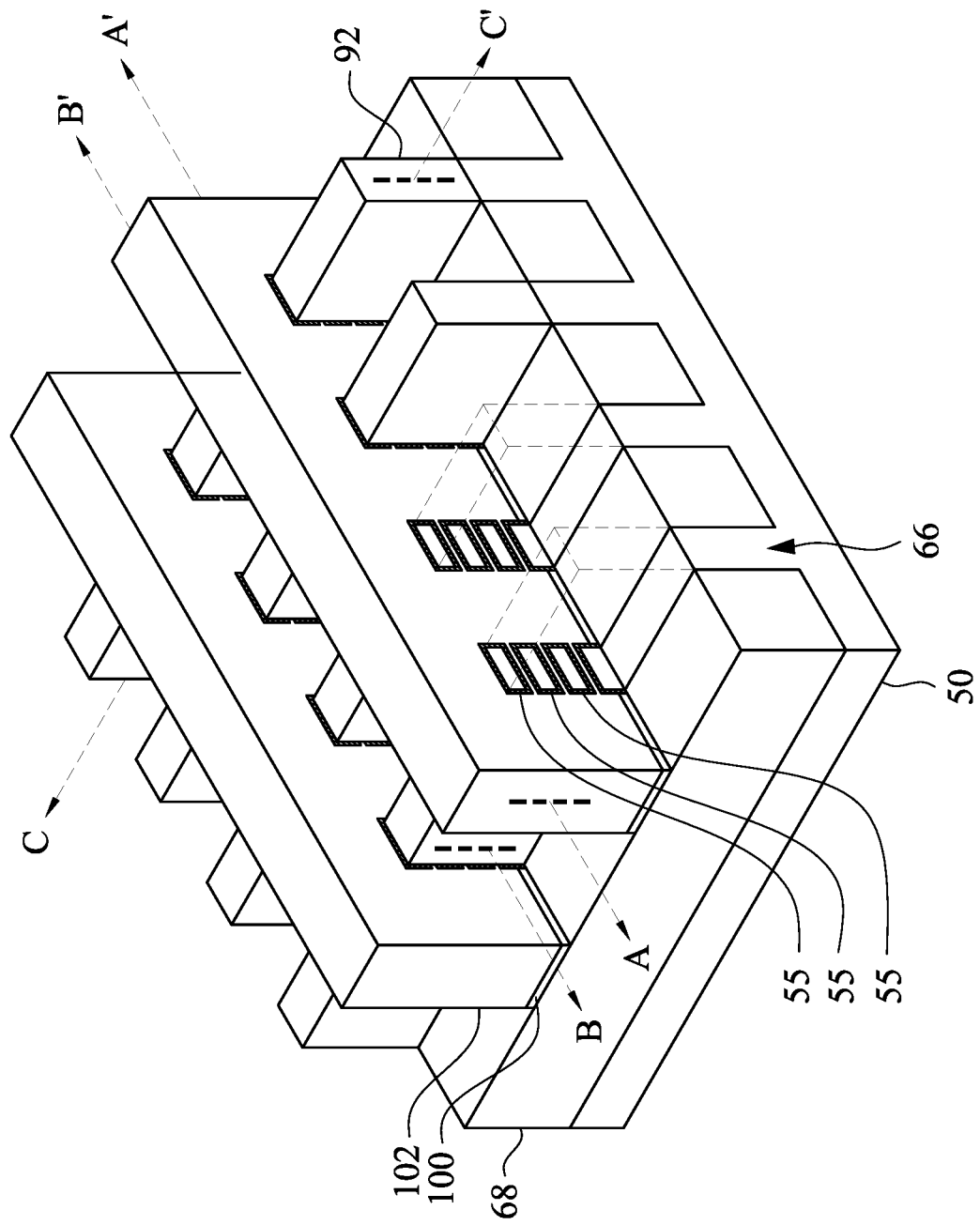
FIG. 1 illustrates an example of nanostructure field-effect transistors (nanostructure FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a backside power via electrically coupled to a front-side source/drain contact and semiconductor devices formed by the same. In some embodiments, the method includes forming a backside power via adjacent an epitaxial source/drain region. The backside power via may include a barrier or liner layer, and a conductive material on the barrier/liner layer. The barrier/liner layer may include materials such as boron nitride (e.g., amorphous boron nitride (a-BN), hexagonal boron nitride (h-BN), or the like), and the conductive material may include materials such as copper, cobalt, tungsten, or the like. A source/drain contact is formed on and electrically coupled to the epitaxial source/drain region and the backside power via. A backside thinning process is performed to expose a backside of the backside power via, and a conductive line, such as a power rail, is formed on the backside power via. Boron nitride has an improved breakdown voltage, provides reduced leakage, acts as a diffusion barrier, may provide improved thermal dissipation, and reduced capacitance as compared with other materials that may be used in the backside power via. Forming the barrier/liner layer of boron nitride, which is a diffusion barrier, allows for greater flexibility in the materials used for the conductive material. As such, the conductive material may include materials such as copper having reduced resistance. The backside power vias may provide improved device performance and reduced device defects.

Some embodiments discussed herein are described in the context of a die including nanostructure field effect transistors (nanostructure FETs). However, various embodiments may be applied to dies including other types of transistors (e.g., fin field effect transistors (FinFETs), planar transistors, or the like) in lieu of or in combination with the nanostructure FETs.

FIG. 1 illustrates an example of nanostructure FETs (e.g., nanowire FETs, nanosheet FETs, gate-all-around FETs (GAA FETs), nano-ribbon FETs, multi-bridge-channel FETs (MBCFETs). or the like) in a three-dimensional view, in accordance with some embodiments. The nanostructure FETs comprise nanostructures 55 (e.g., nanosheets, nanowires, nano-ribbons, or the like) over fins 66 on a substrate 50 (e.g., a semiconductor substrate), wherein the nanostructures 55 act as channel regions for the nanostructure FETs. The nanostructures 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the substrate 50 alone or a combination of the substrate 50 and the STI regions 68. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 (source/drain regions may refer to a source or a drain, individually or collectively, dependent upon the context) are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nanostructure FET. Cross-section B-B' is parallel to cross-section A-A' and extends through epitaxial source/drain regions 92 of multiple nanostructure FETs. Cross-section C-C' is perpendicular to cross-section A-A' and is parallel to a longitudinal axis of a fin 66 of the nanostructure FET and in a direction of, for example, a current flow between the epitaxial source/drain regions 92 of the nanostructure FET. Subsequent figures refer to these reference cross-sections for clarity.

Some embodiments discussed herein are discussed in the context of nanostructure FETs formed using a gate-last process. In some embodiments, a gate-first process may be used. Also, some embodiments contemplate aspects used in planar devices, such as planar FETs or in fin field-effect transistors (FinFETs).

FIGS. 2 through 27C are cross-sectional views of intermediate stages in the manufacturing of nanostructure FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, and 27A illustrate reference cross-section A-A' illustrated in FIG. 1. FIGS. 6B, 7B, 8B, 9B, 10B, 11B, 12B, 13B, 14B, 15B, 16B, 17B, 18B, 19B, 20B, 21B, 22B, 23B, 24B, 25B, 26B, and 27B illustrate reference cross-section B-B' illustrated in FIG. 1. FIGS. 6C, 7C, 8C, 9C, 10C, 11C, 11D, 12C, 13C, 14C, 15C, 16C, 17C, 18C, 19C, 20C, 21C, 22C, 23C, 24C, 25C, 26C, and 27C illustrate reference cross-section C-C' illustrated in FIG. 1. FIG. 20D illustrates a top-down view.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or un-doped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 illustrated in FIG. 2 is a multi-layered substrate that includes a core substrate 50A, an etch stop layer 50B, and a semiconductor layer 50C. The etch stop layer 50B may be formed of a material having a high etch selectivity to materials of the core substrate 50A and the semiconductor layer 50C. As such, the etch stop layer 50B may be removed without significantly removing the core substrate 50A and/or the semiconductor layer 50C, and either of the core substrate 50A and the semiconductor layer 50C may be removed without significantly removing the etch stop layer 50B. In some embodiments, the core substrate 50A may include silicon, the etch stop layer 50B may include silicon germanium, and the semiconductor layer 50C may include silicon. In some embodiments, the etch stop layer 50B may be formed of a dielectric material, such as phosphosilicate glass (PSG), borosilicate glass (BSG), boron-doped phosphosilicate glass (BPSG), un-doped silicate glass (USG), silicon nitride, silicon oxide, silicon oxynitride, or the like. In some embodiments, the core substrate 50A, the etch stop layer 50B, and the semiconductor layer 50C may include any of the materials described above for the substrate 50. The etch stop layer 50B and the core substrate 50A may be epitaxially grown using processes such as chemical vapor deposition (CVD), atomic layer deposition (ALD), vapor phase epitaxy (VPE), molecular beam epitaxy (MBE), or the like.

The substrate 50 includes an n-type region 50N and a p-type region 50P. The n-type region 50N can be for forming n-type devices, such as NMOS transistors, e.g., n-type nanostructure FETs, and the p-type region 50P can be for forming p-type devices, such as PMOS transistors, e.g., p-type nanostructure FETs. The n-type region 50N may be physically separated from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nanostructure FETs in the n-type region 50N and the p-type region 50P. However, in some embodiments the first semiconductor layers 51 may be removed and the second semiconductor layers 53 may be patterned to form channel regions of nanostructure FETs in the n-type region 50N, and the second semiconductor layers 53 may be removed and the first semiconductor layers 51 may be patterned to form channel regions of nanostructure FETs in the p-type region 50P. In some embodiments the second semiconductor layers 53 may be removed and the first semiconductor layers 51 may be patterned to form channel regions of nanostructure FETs in the n-type region 50N, and the first semiconductor layers 51 may be removed and the second semiconductor layers 53 may be patterned to form channel regions of nanostructure FETs in the p-type region 50P. In some embodiments, the second semiconductor layers 53 may be removed and the first semiconductor layers 51 may be patterned to form channel regions of nanostructure FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as CVD, ALD, VPE, MBE, or the like. In some embodiments, the first semiconductor layers 51 may be formed of a first semiconductor material, such as silicon germanium or the like, and the second semiconductor layers 53 may be formed of a second semiconductor material, such as silicon, silicon carbon, or the like. The multi-layer stack 64 is illustrated as having a bottommost first semiconductor layer 51 formed of the first semiconductor material for illustrative purposes. In some embodiments, the multi-layer stack 64 may be formed having a bottommost second semiconductor layer 53 formed of the second semiconductor material.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of resulting nanostructure FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of resulting nanostructure FETs.

In FIG. 3, fins 66 are formed in and/or on the substrate 50 and nanostructures 55 are formed in the multi-layer stack 64. In some embodiments, the nanostructures 55 may be formed in the multi-layer stack 64, and the fins 66 may be formed in the core substrate 50A, the etch stop layer 50B, and the semiconductor layer 50C (see FIG. 2) by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55. Forming the fins 66 by etching the substrate 50 may define lower fin portions 56 from the core substrate 50A, middle fin portions 57 from the etch stop layer 50B, and upper fin portions 58 from the semiconductor layer 50C.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 and the nanostructures 55 in the n-type region 50N and the p-type region 50P as having substantially equal widths for illustrative purposes. In some embodiments, widths of the fins 66 and the nanostructures 55 in the n-type region 50N may be greater or thinner than widths of the fins 66 and the nanostructures 55 in the p-type region 50P. Further, while each of the fins 66 and the nanostructures 55 are illustrated as having a consistent width throughout, in some embodiments, the fins 66 and/or the nanostructures 55 may have tapered sidewalls such that a width of each of the fins 66 and/or the nanostructures 55 continuously increases in a direction towards the core substrate 50A. In such embodiments, each of the nanostructures 55 may have a different width and be trapezoidal in shape.

Figure 4:
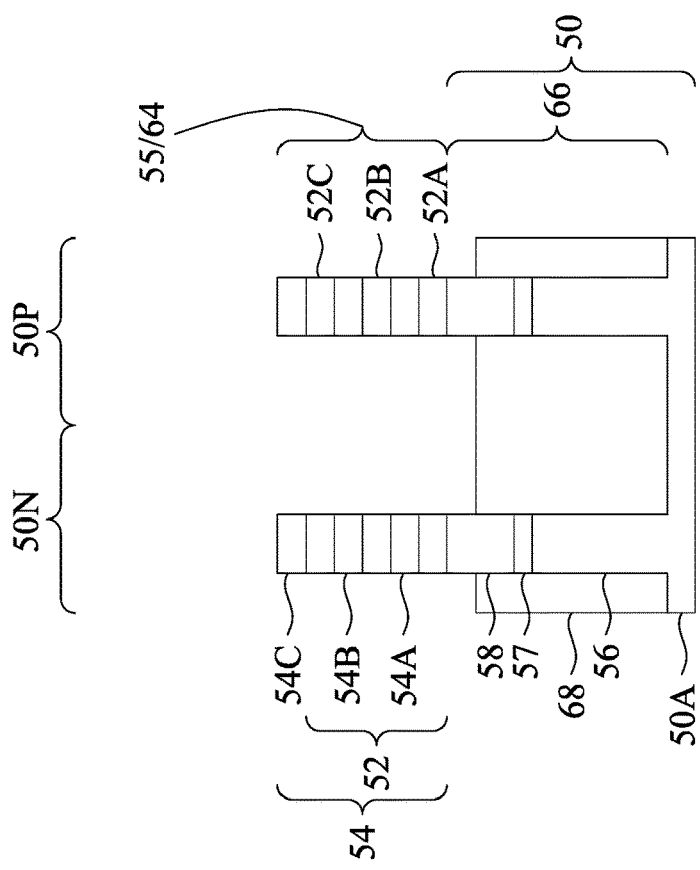

In FIG. 4, shallow trench isolation (STI) regions 68 are formed adjacent the fins 66. The STI regions 68 may be formed by depositing an insulation material on the core substrate 50A, the fins 66, and the nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the fins 66 and the nanostructures 55. Although the insulation material is illustrated as a single layer, some embodiments may utilize multiple layers. For example, in some embodiments a liner (not separately illustrated) may first be formed along a surface of the core substrate 50A, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that the nanostructures 55 and upper portions of the fins 66 protrude from between neighboring STI regions 68. Further, the top surfaces of the STI regions 68 may be flat as illustrated, or may be convex, concave (such as dished), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the materials of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66, the nanostructures 55, and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
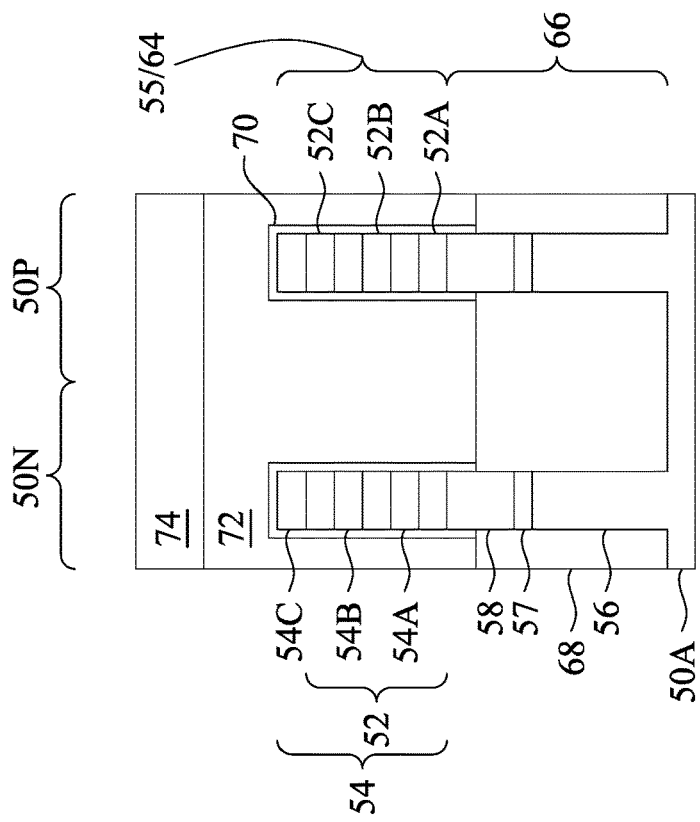

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etch selectivity from the etching of isolation regions (e.g., the STI regions 68). The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
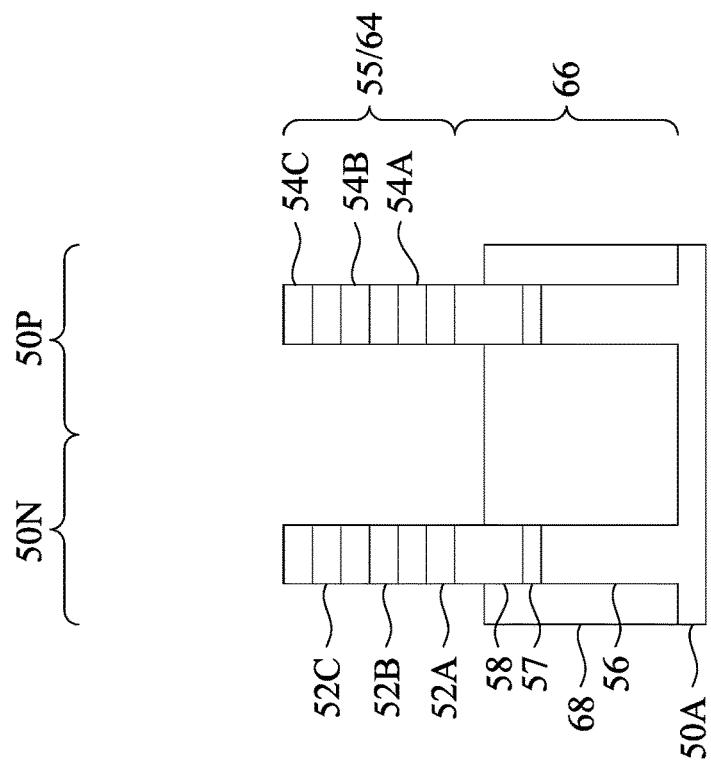
Figure 6A:
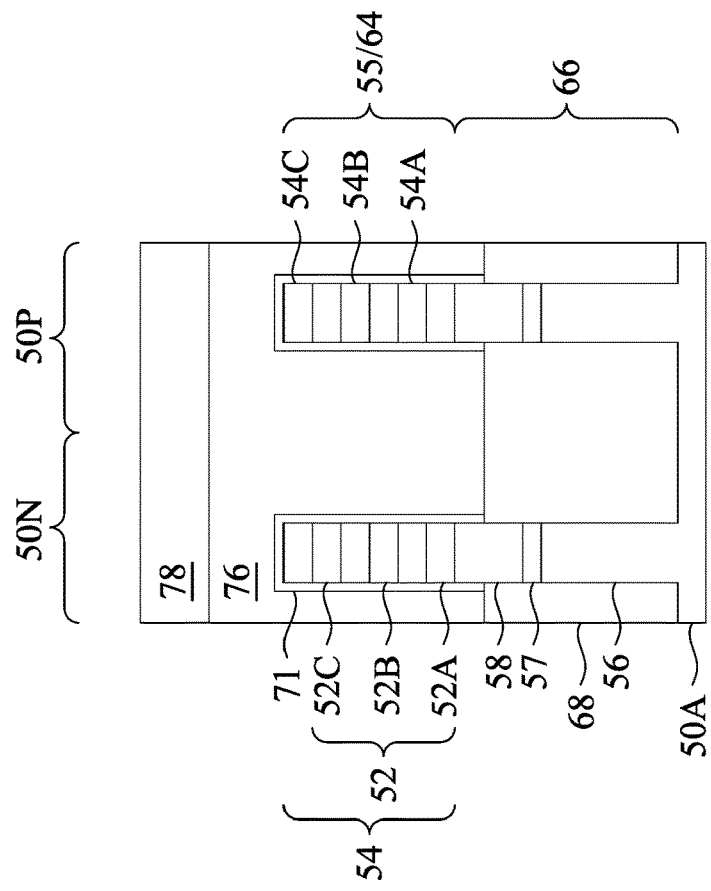
Figure 6C:
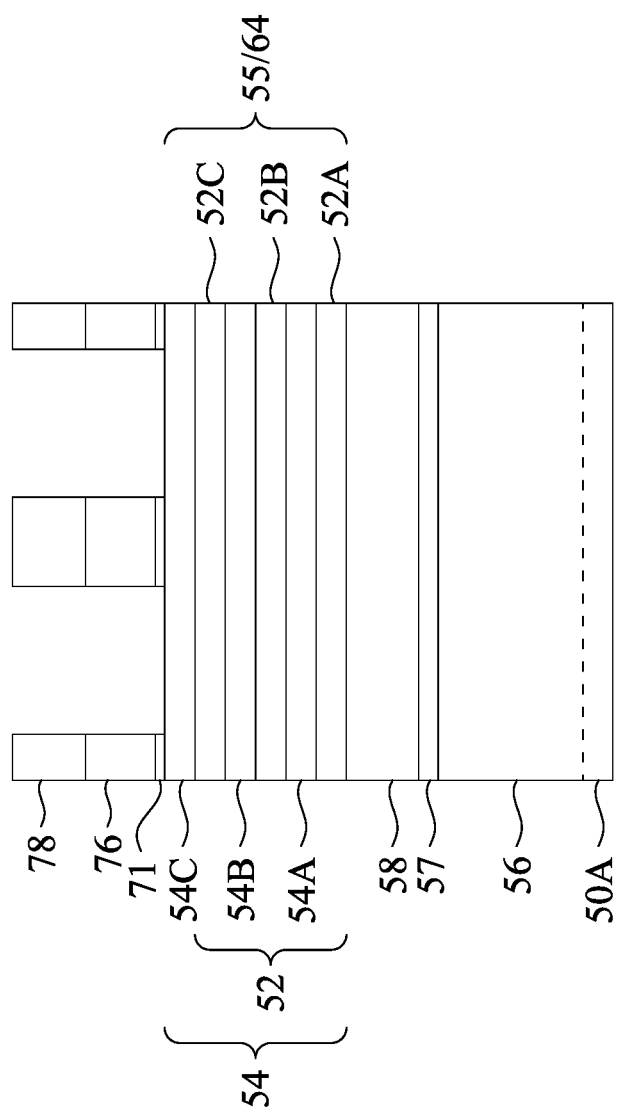

FIGS. 6A through 27C illustrate various additional steps in the manufacturing of embodiment devices. FIGS. 6C, 7C, 8C, 9C, 10C, 11C, 11D, 12C, 13C, 14C, 15C, 16C, 17C, 18C, 19C, 20C, 21C, 22C, 23C, 24C, 25C, 26C, and 27C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have a lengthwise direction substantially perpendicular to lengthwise directions of respective fins 66 and nanostructures 55.

Figure 7B:
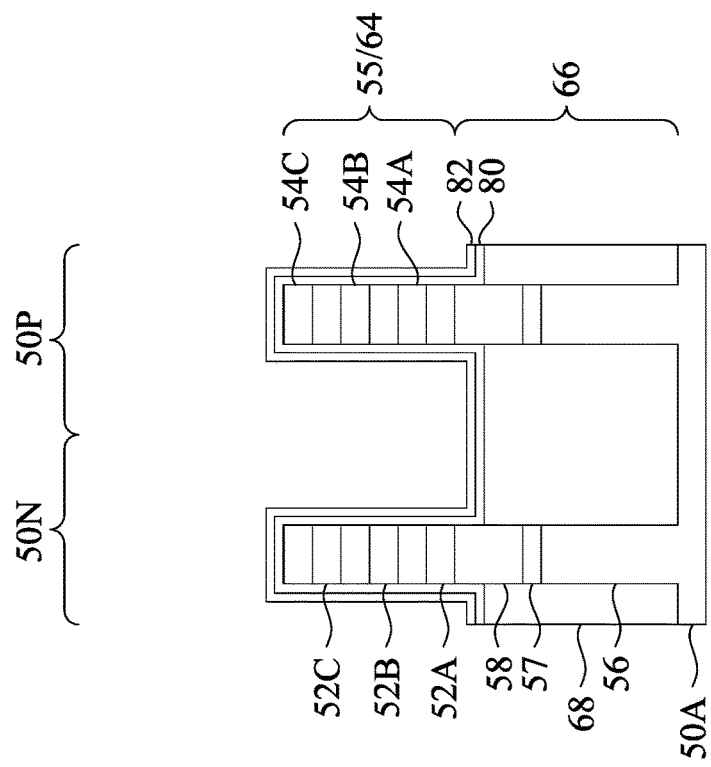
Figure 7A:
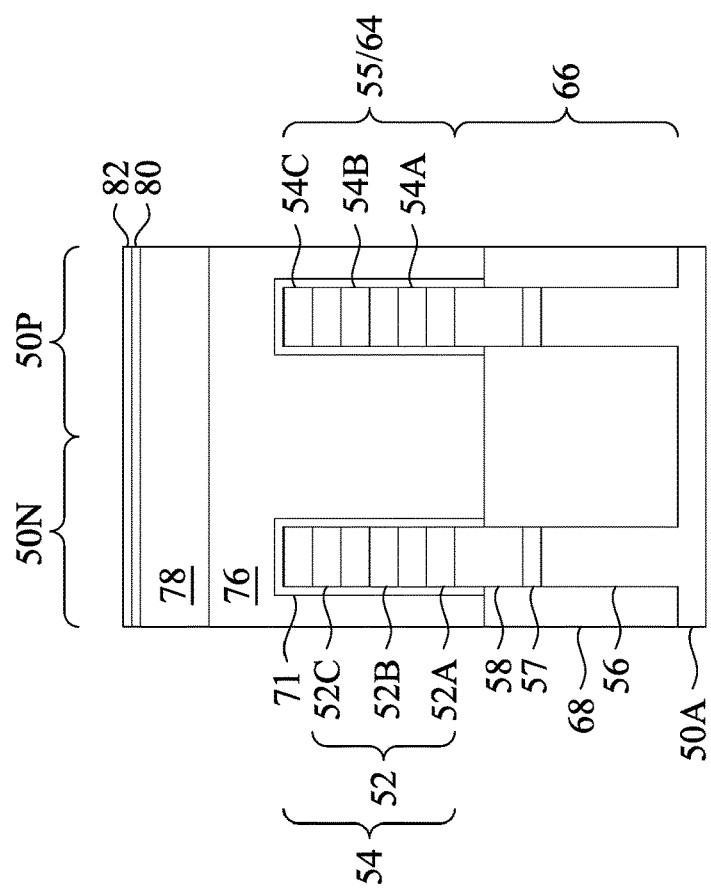
Figure 7C:
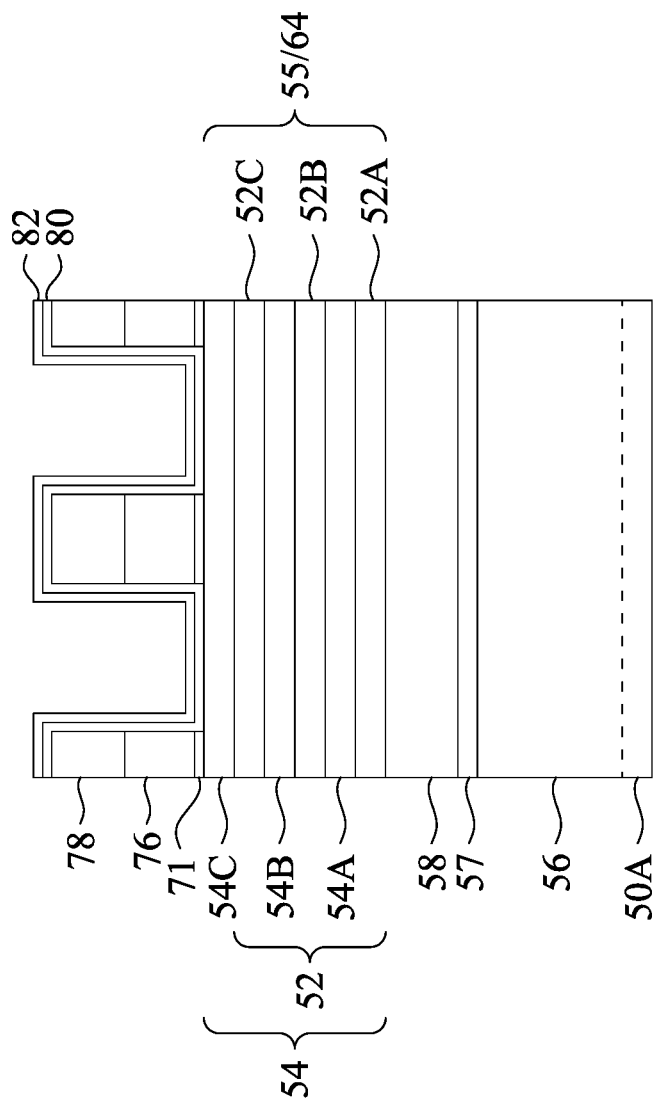

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and side surfaces of the nanostructures 55 and the masks 78; and side surfaces of the fins 66, the dummy gates 76, and the dummy gate dielectrics 71. The second spacer layer 82 is deposited on the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
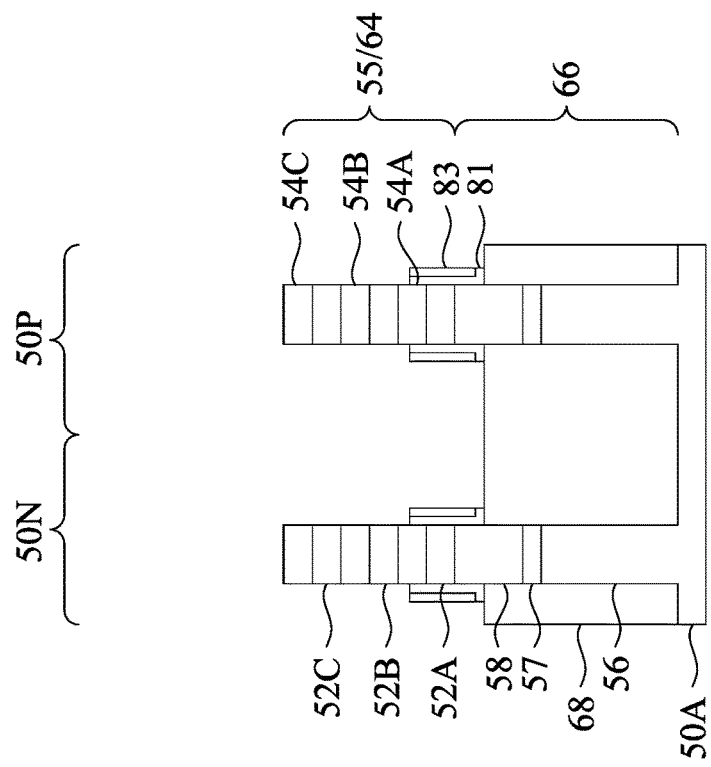
Figure 8A:
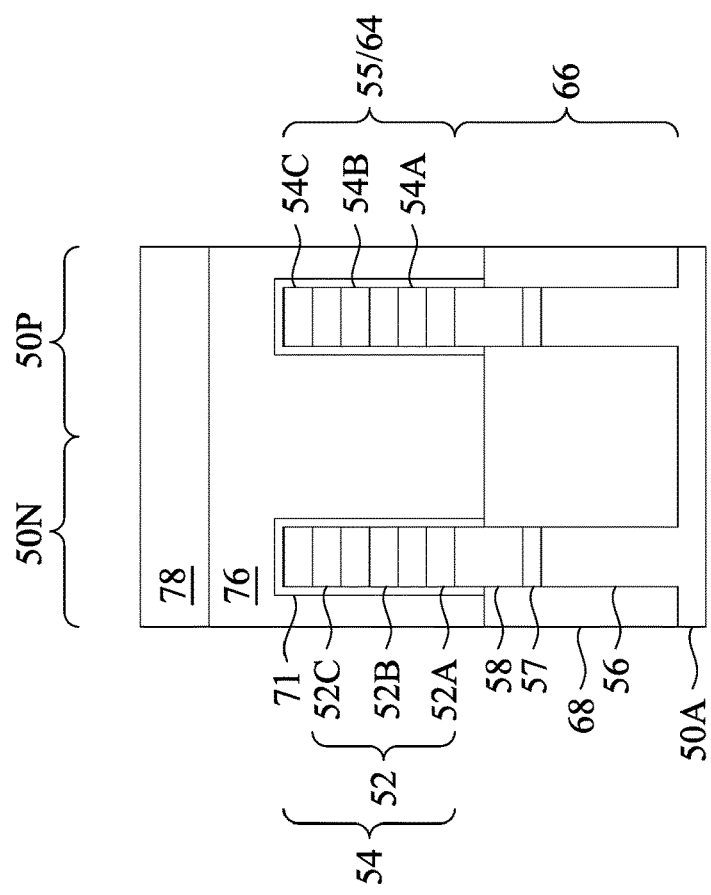
Figure 8C:
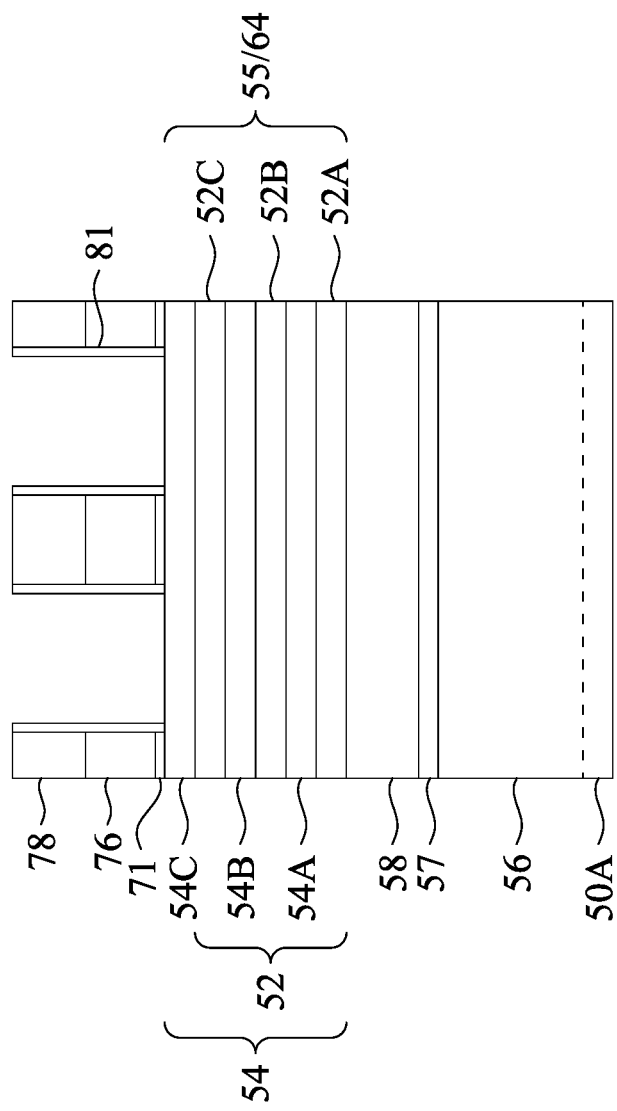

In FIGS. 8A through 8C, the first spacer layer 80 and the second spacer layer 82 are etched to form first spacers 81 and second spacers 83. The first spacers 81 and the second spacers 83 will subsequently act as spacers for forming self-aligned source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate from the material of the first spacer layer 80, such that the first spacer layer 80 may act as an etch stop layer when patterning the second spacer layer 82 and the second spacer layer 82 may act as a mask when patterning the first spacer layer 80. The second spacer layer 82 may be etched using an anisotropic etch process with the first spacer layer 80 acting as an etch stop layer, and remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and the nanostructures 55 in a cross-sectional view. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71 in a cross-sectional view. In some embodiments, a portion of the second spacer layer 82 may remain over the first spacer layer 80 adjacent the masks 78, the dummy gates 76, and the dummy gate dielectrics 71 in the cross-sectional view illustrated in FIG. 8C.

It is noted that the above disclosure generally describes a process of forming spacers and LDD regions. Other processes and sequences may be used. For example, fewer or additional spacers may be utilized, different sequences of steps may be utilized (e.g., the first spacer layer 80 may be patterned to form the first spacers 81 prior to depositing the second spacer layer 82), additional spacers may be formed and removed, and/or the like. Furthermore, the n-type and p-type devices may be formed using different structures and steps.

Figure 9B:
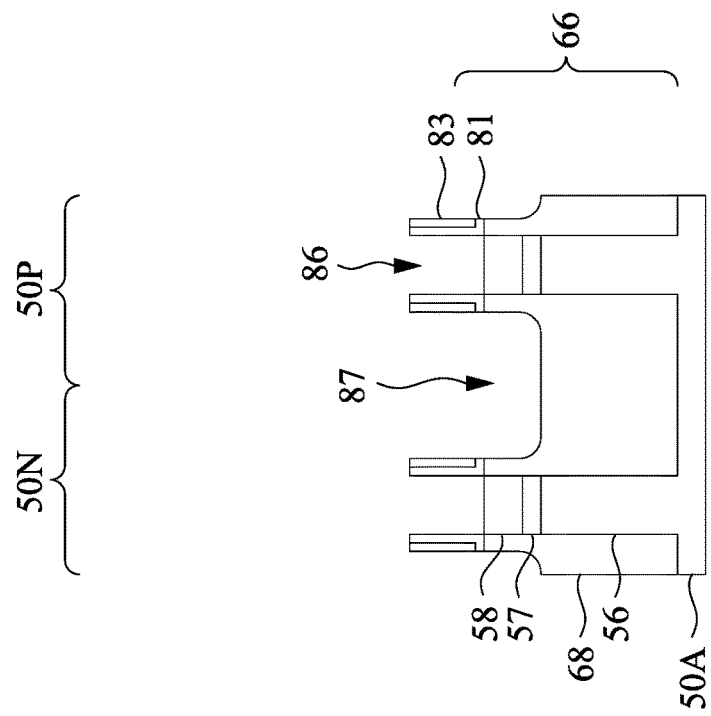
Figure 9A:
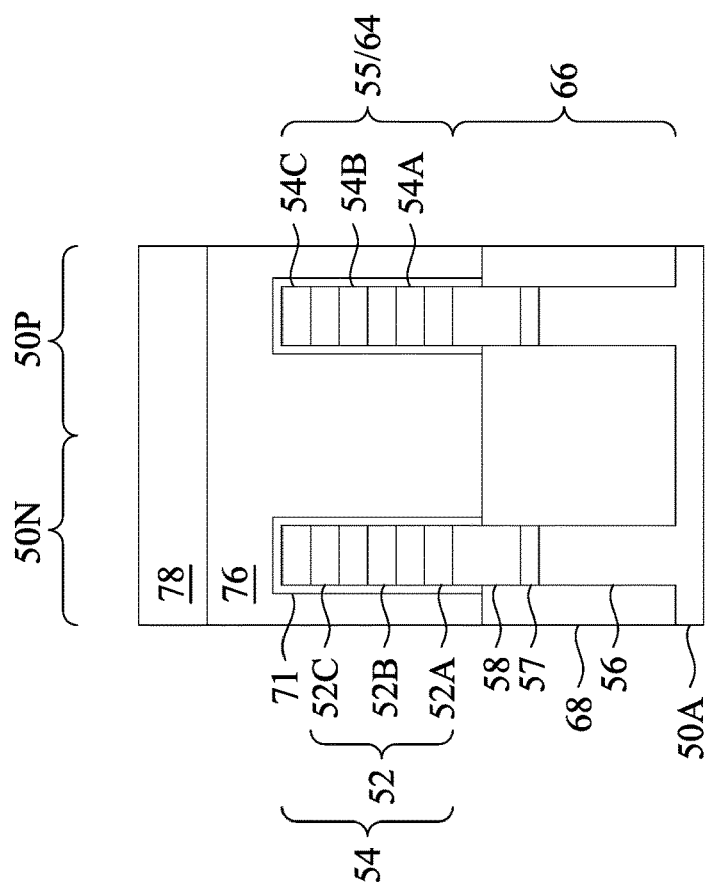
Figure 9C:
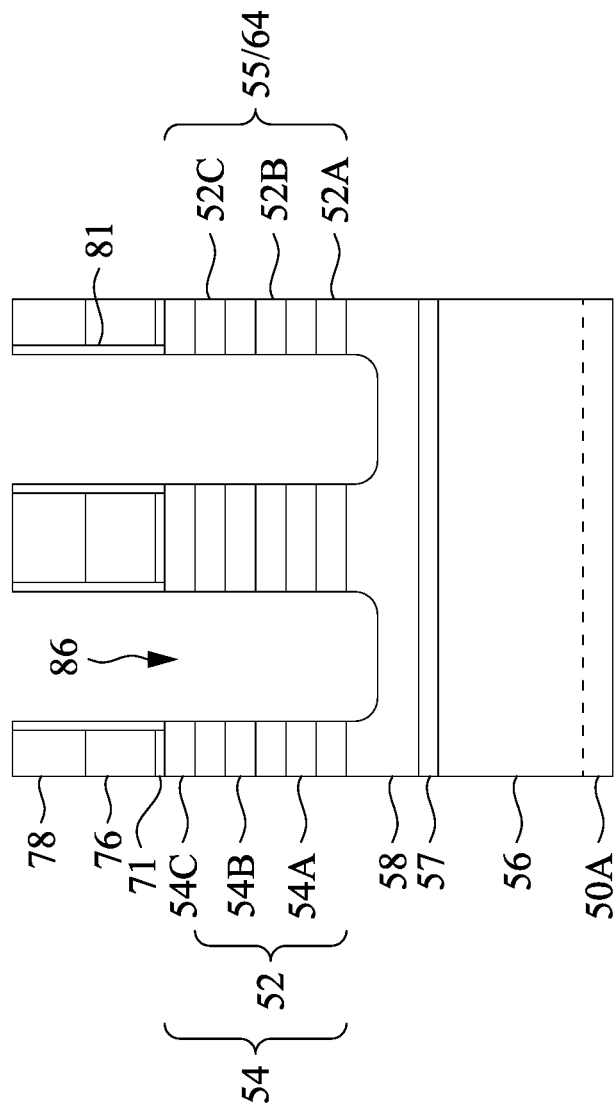

In FIGS. 9A through 9C, first recesses 86 are formed in the nanostructures 55 and the fins 66. Epitaxial source/drain regions will be subsequently formed in the first recesses 86. The first recesses 86 may extend through the first nanostructures 52 and the second nanostructures 54, and into the fins 66. As illustrated in FIG. 9B, top surfaces of the STI regions 68 may be level with bottom surfaces of the first recesses 86. In some embodiments, the fins 66 may be etched such that bottom surfaces of the first recesses 86 are disposed above or below the top surfaces of the STI regions 68.

Further in FIGS. 9A through 9C, second recesses 87 are formed in the STI regions 68. Backside power vias will be subsequently formed in the second recesses 87. The second recesses 87 may extend into the STI regions 68 such that bottom surfaces of the second recesses 87 are level with bottom surfaces of the middle fin portions 57. In some embodiments, the STI regions 68 may be etched such that bottom surfaces of the second recesses 87 are disposed above or below the bottom surfaces of the middle fin portions 57. Forming the second recesses 87 extending to a depth such that the bottom surfaces of the second recesses 87 are level with or below top surfaces of the middle fin portions 57 allows for the backside power vias subsequently formed in the second recesses 87 to be exposed by removing the core substrate 50A and/or the middle fin portions 57.

The first recesses 86 and the second recesses 87 may be formed by etching the nanostructures 55, the fins 66, and the STI regions 68 using anisotropic etching processes, such as RIE, NBE, or the like. The first spacers 81, the second spacers 83, and the masks 78 mask portions of the nanostructures 55, the fins 66, and the STI regions 68 during the etching processes used to form the first recesses 86 and the second recesses 87. A single etch process or multiple etch processes may be used to etch each layer of the nanostructures 55 and/or the fins 66; and the STI regions 68 may be etched together with or separately from the nanostructures 55 and/or the fins 66. Timed etch processes may be used to stop the etching after the first recesses 86 and the second recesses 87 reach desired depths.

Figure 10B:
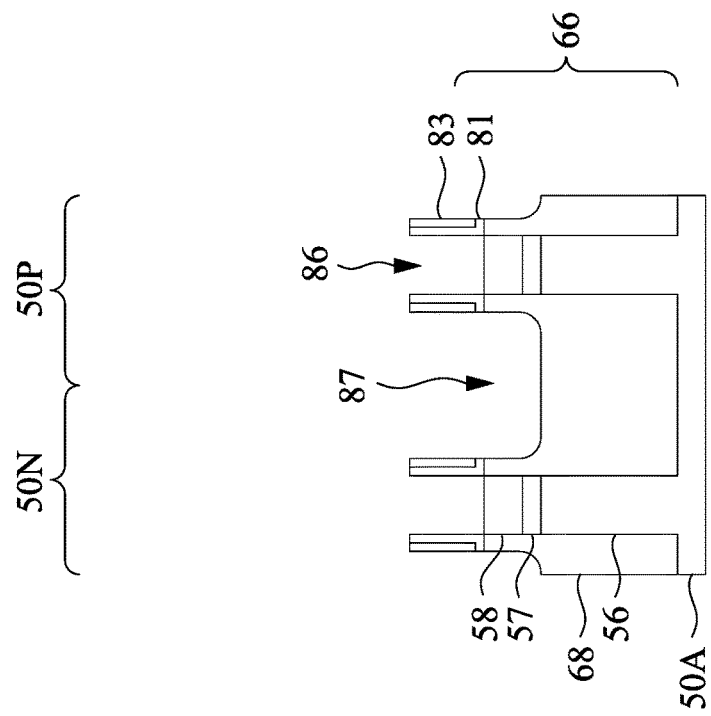
Figure 10A:
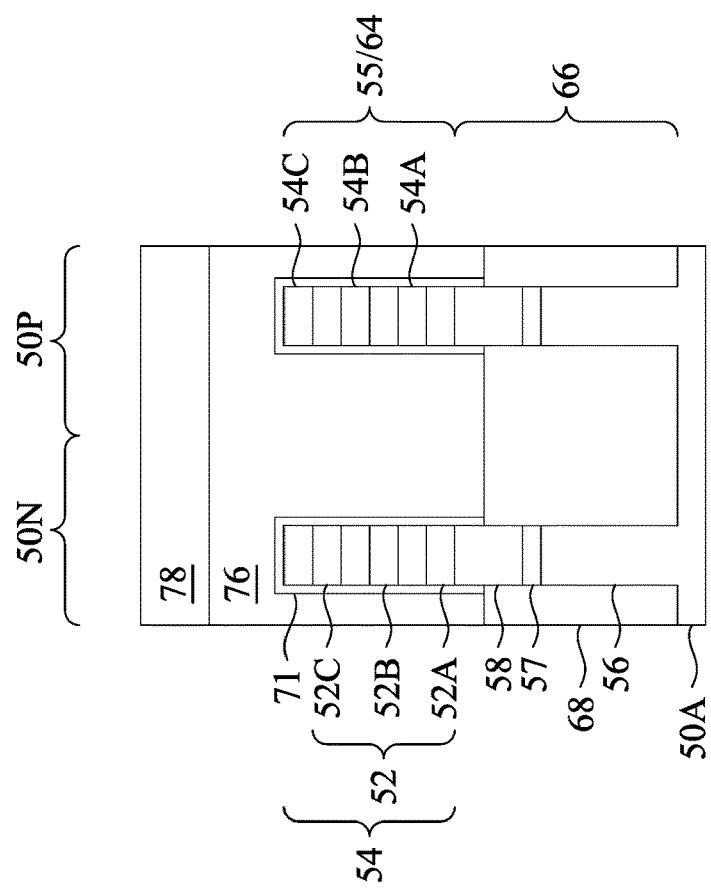
Figure 10C:
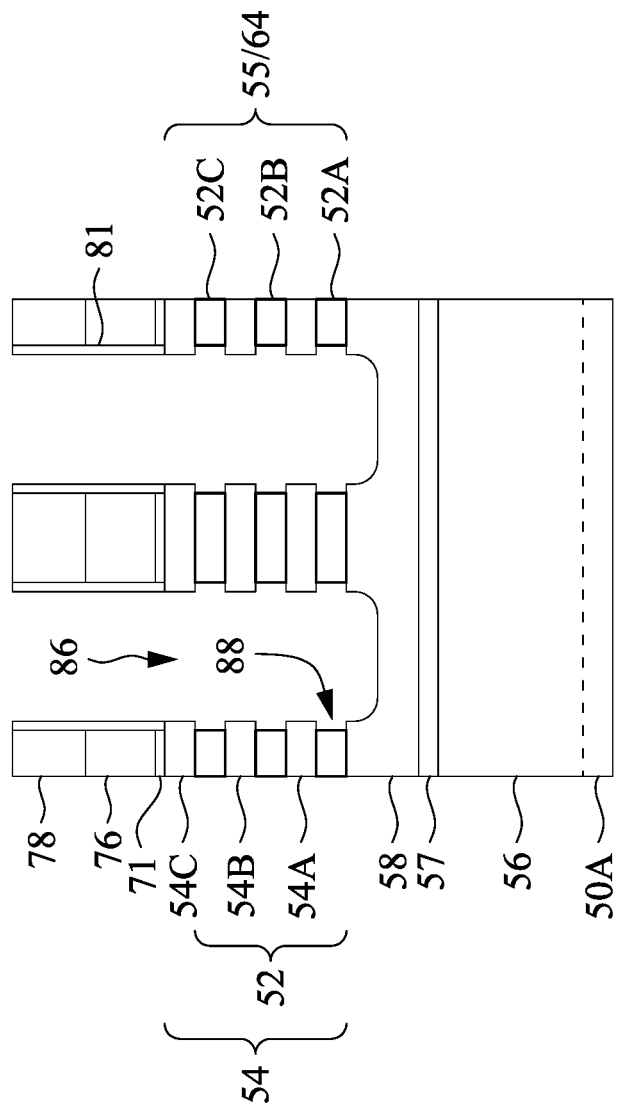

In FIGS. 10A through 10C, portions of side surfaces of the layers of the multi-layer stack 64 formed of the first semiconductor materials (e.g., the first nanostructures 52) exposed by the first recesses 86 are etched to form sidewall recesses 88. Although side surfaces of the first nanostructures 52 adjacent the sidewall recesses 88 are illustrated as being straight in FIG. 10C, the side surfaces may be concave or convex. The side surfaces may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, source/drain regions will be formed in the first recesses 86, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11B:
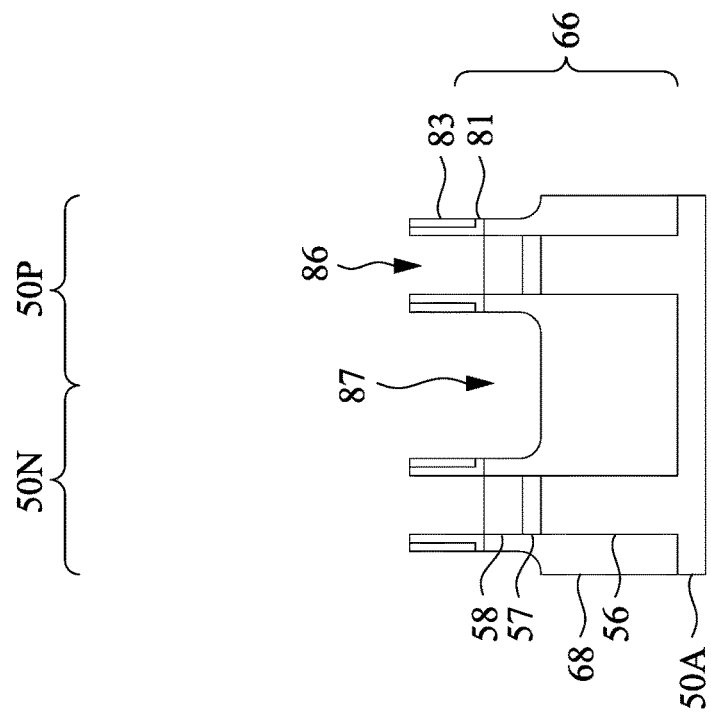
Figure 11A:
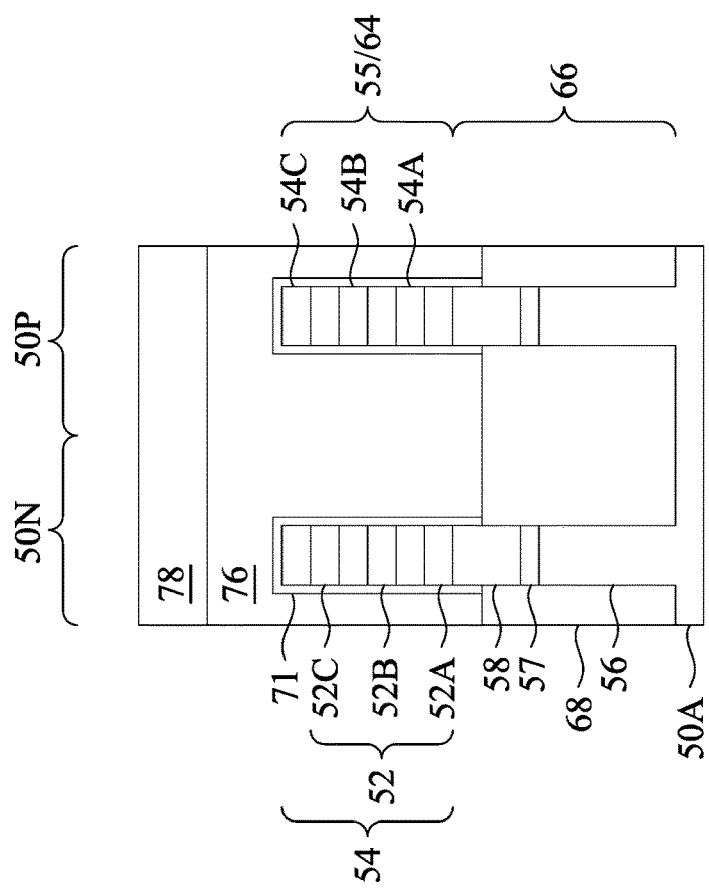
Figure 11C:
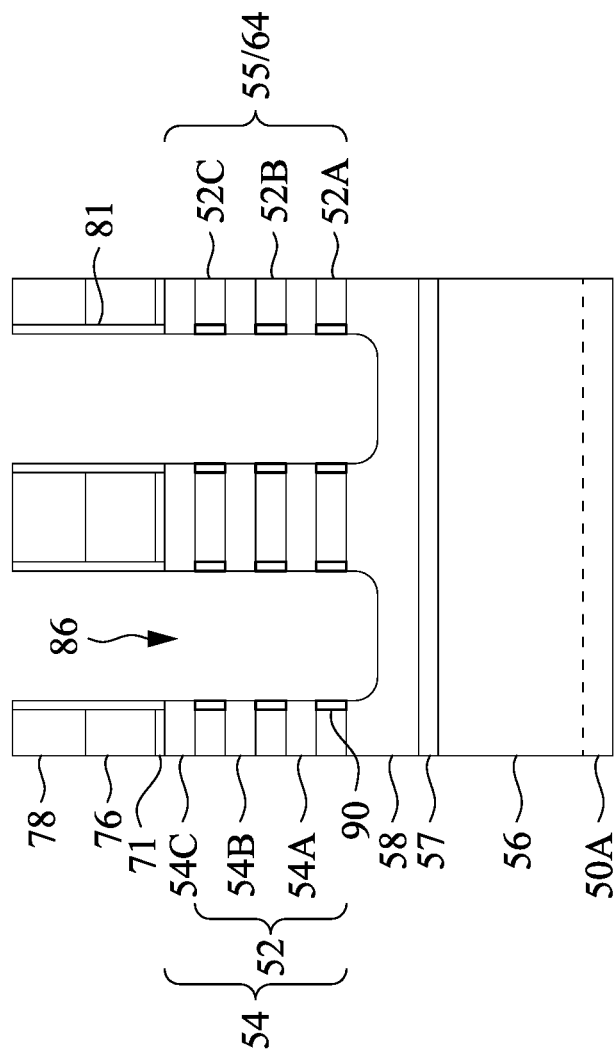
Figure 11D:
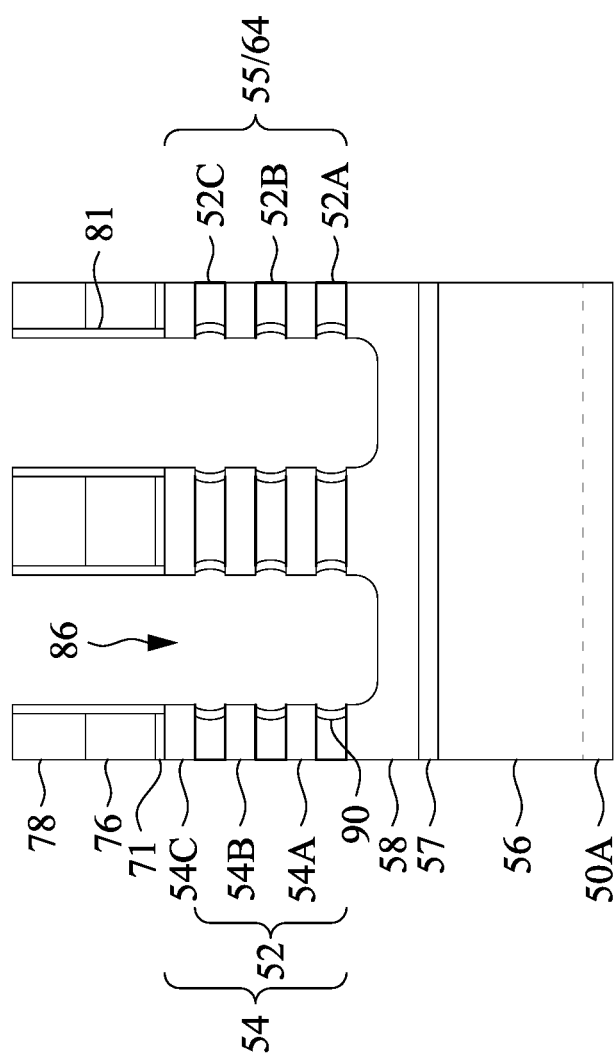

Although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12C) by subsequent etching processes, such as etching processes used to form gate structures.

Figure 12B:
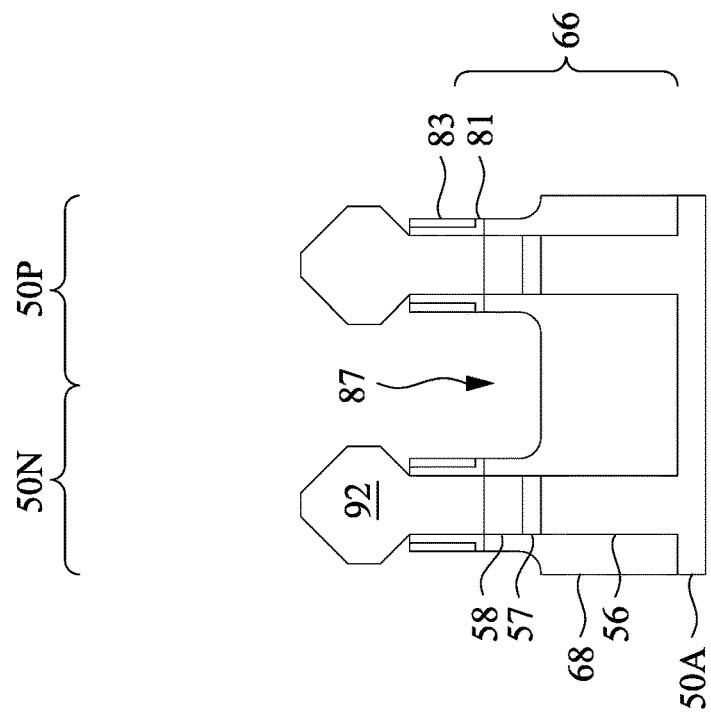
Figure 12A:
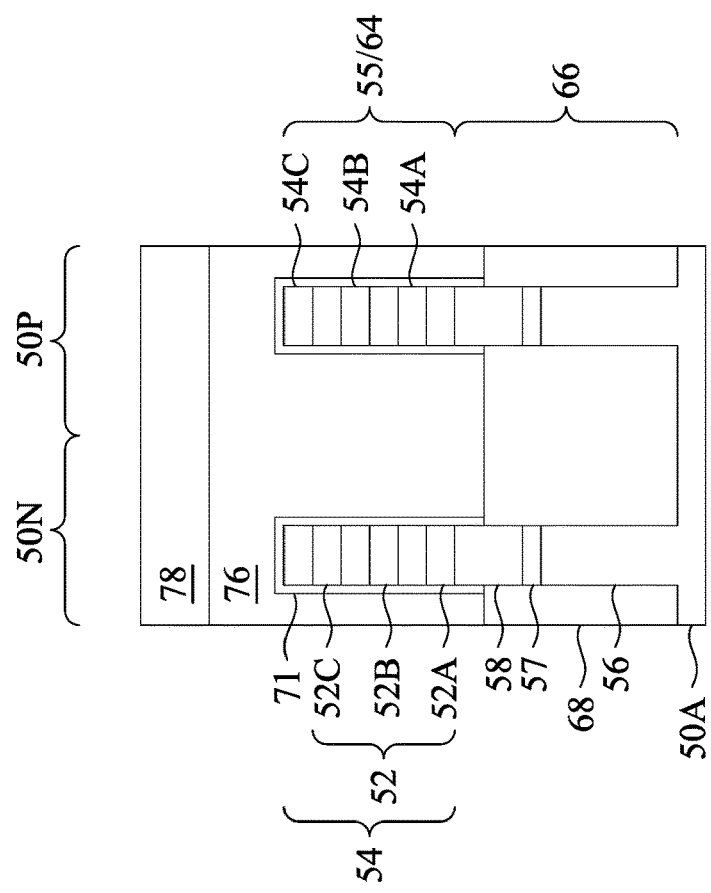
Figure 12C:
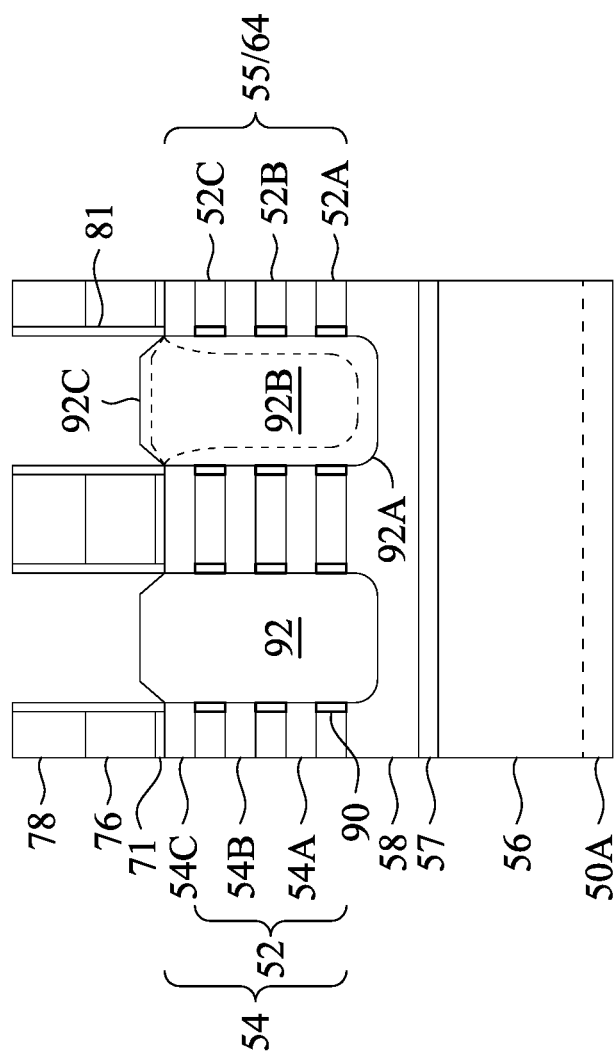

In FIGS. 12A through 12C, epitaxial source/drain regions 92 are formed in the first recesses 86. Source/drain regions may refer to a source or a drain, individually or collectively, dependent upon the context. The epitaxial source/drain regions 92 may be epitaxially grown in the first recesses 86 using a process such as chemical vapor deposition (CVD), atomic layer deposition (ALD), vapor phase epitaxy (VPE), molecular beam epitaxy (MBE), or the like. In some embodiments, the epitaxial source/drain regions 92 may exert stress on the second nanostructures 54, thereby improving performance. As illustrated in FIG. 12C, the epitaxial source/drain regions 92 are formed in the first recesses 86 such that each dummy gate 76 is disposed between respective neighboring pairs of the epitaxial source/drain regions 92. In some embodiments, the first spacers 81 are used to separate and laterally space the epitaxial source/drain regions 92 apart from the dummy gates 76. The first inner spacers 90 are used to separate and laterally space the epitaxial source/drain regions 92 apart from the nanostructures 55 by an appropriate lateral distance so that the epitaxial source/drain regions 92 do not short out with subsequently formed gates of the resulting nanostructure FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for forming source/drain regions in n-type nanostructure FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for forming source/drain regions in p-type nanostructure FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, the fins 66, and/or the core substrate 50A may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nanostructure FET to merge. In some embodiments, adjacent epitaxial source/drain regions 92 remain separated after the epitaxy process is completed, as illustrated by FIG. 12B. In the embodiment illustrated in FIG. 12B, the first spacers 81 may be formed extending to top surfaces of the STI regions 68, thereby blocking the epitaxial growth of the epitaxial source/drain regions 92. In some embodiments, the first spacers 81 may cover portions of the sidewalls of the nanostructures 55 further blocking the epitaxial growth. In some embodiments, the spacer etch used to form the first spacers 81 may be adjusted to remove the spacer material to allow the epitaxially grown region to extend to the top surfaces of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 13B:
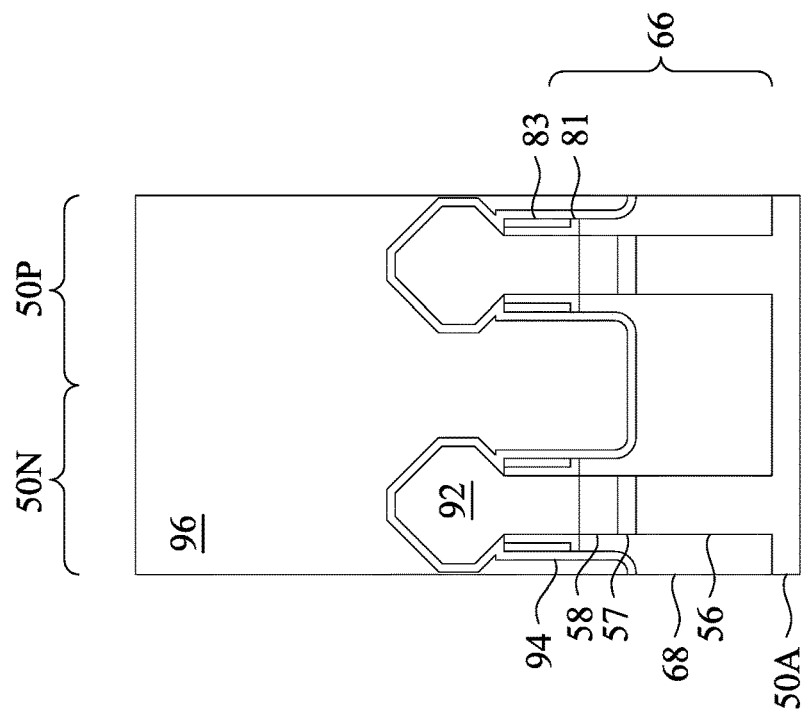
Figure 13A:
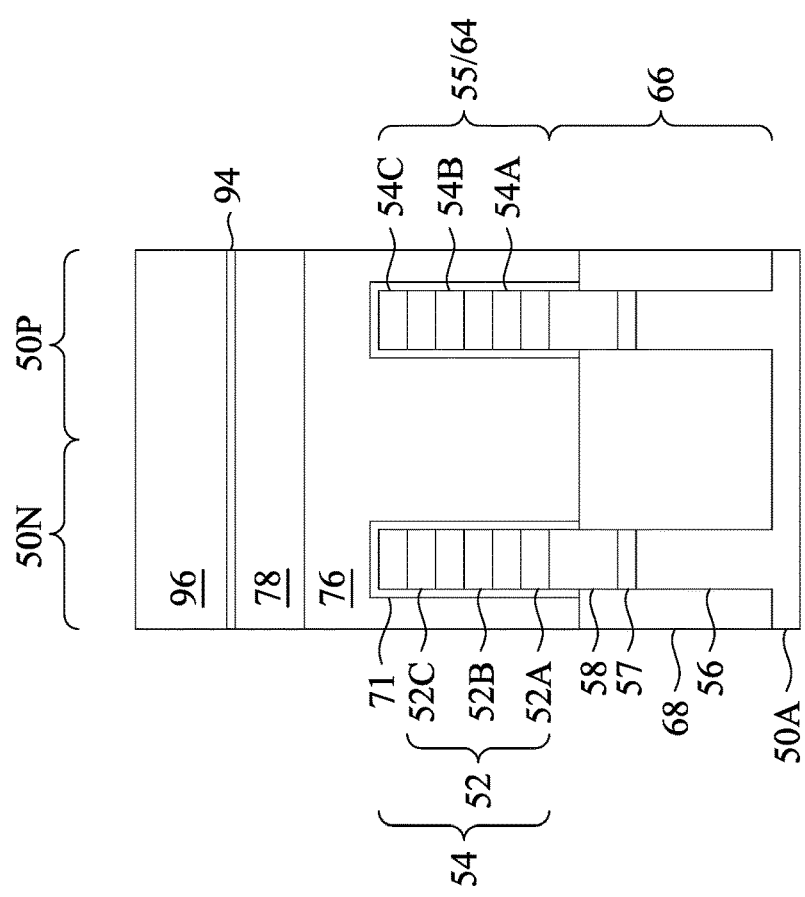
Figure 13C:
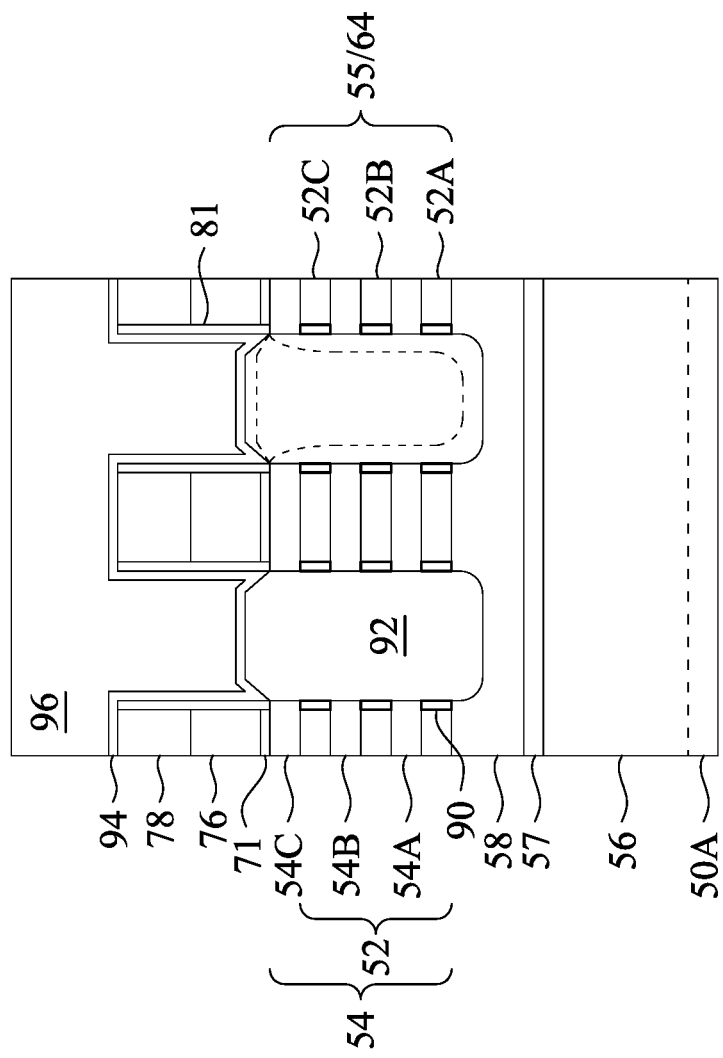

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include PSG, BSG, BPSG, USG, or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81, the second spacers 83, and the STI regions 68. The CESL 94 may comprise a dielectric material, such as, silicon nitride, silicon oxide, silicon oxynitride, or the like, having a different etch rate than the material of the overlying first ILD 96.

Figure 14B:
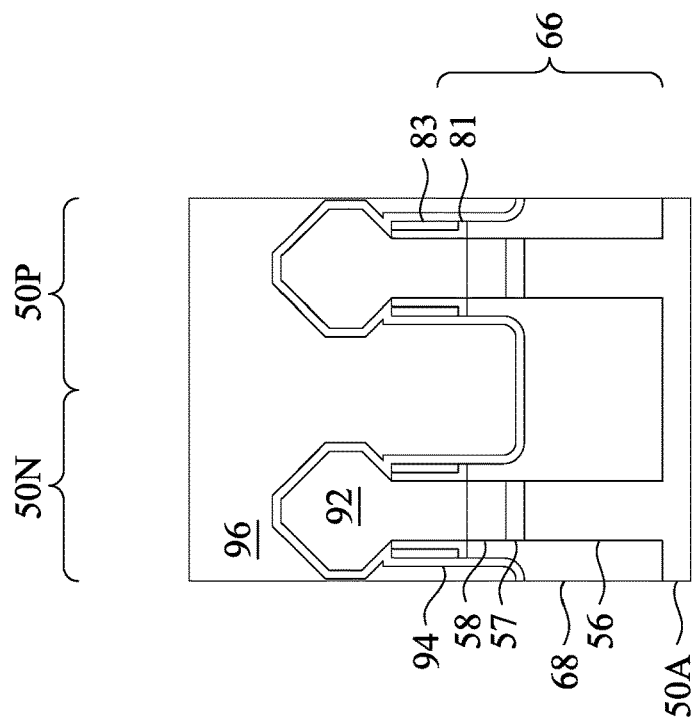
Figure 14A:
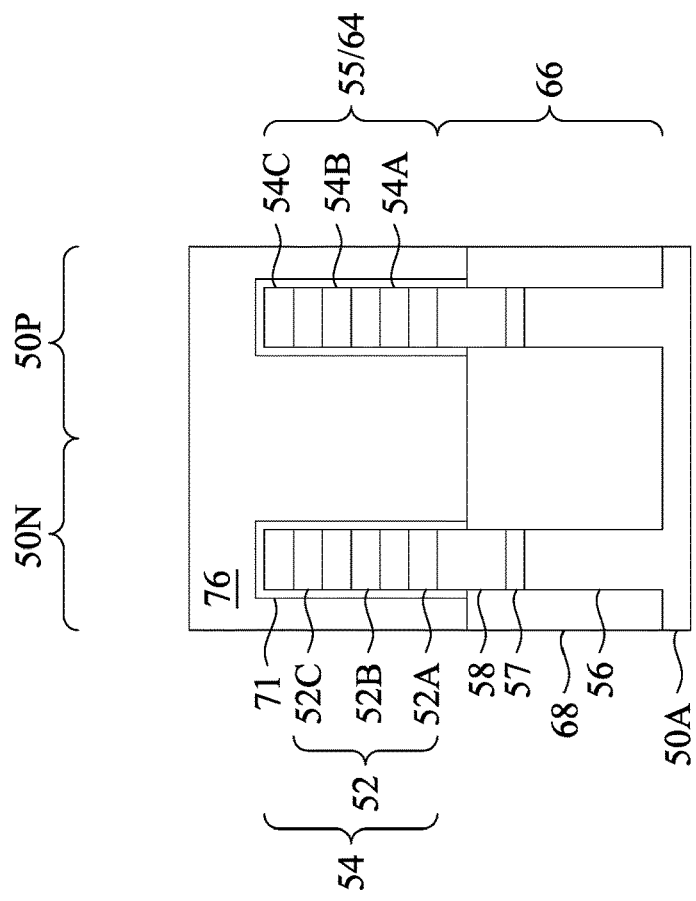
Figure 14C:
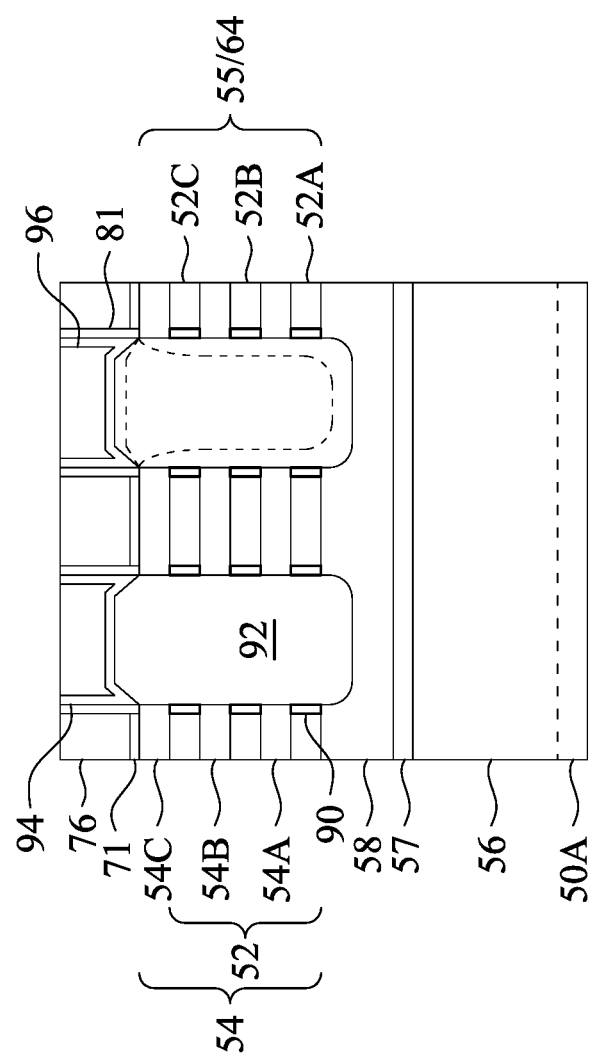

In FIGS. 14A through 14C, a planarization process, such as a CMP, is performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, the first ILD 96, and the CESL 94 are level within process variations. Accordingly, top surfaces of the dummy gates 76 are exposed through the first ILD 96 and the CESL 94. In some embodiments, the masks 78 may remain, in which case the planarization process levels top surfaces of the first ILD 96 and the CESL 94 with top surfaces of the masks 78 and the first spacers 81.

Figure 15B:
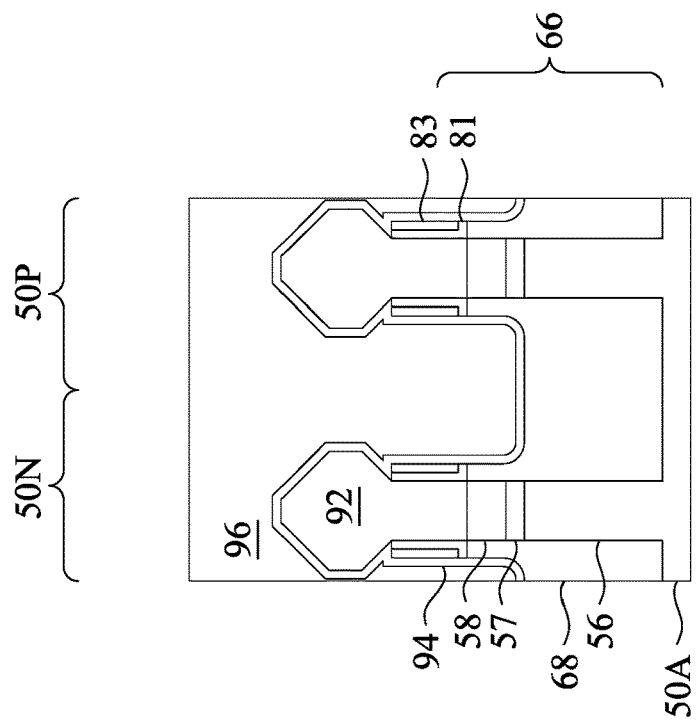
Figure 15A:
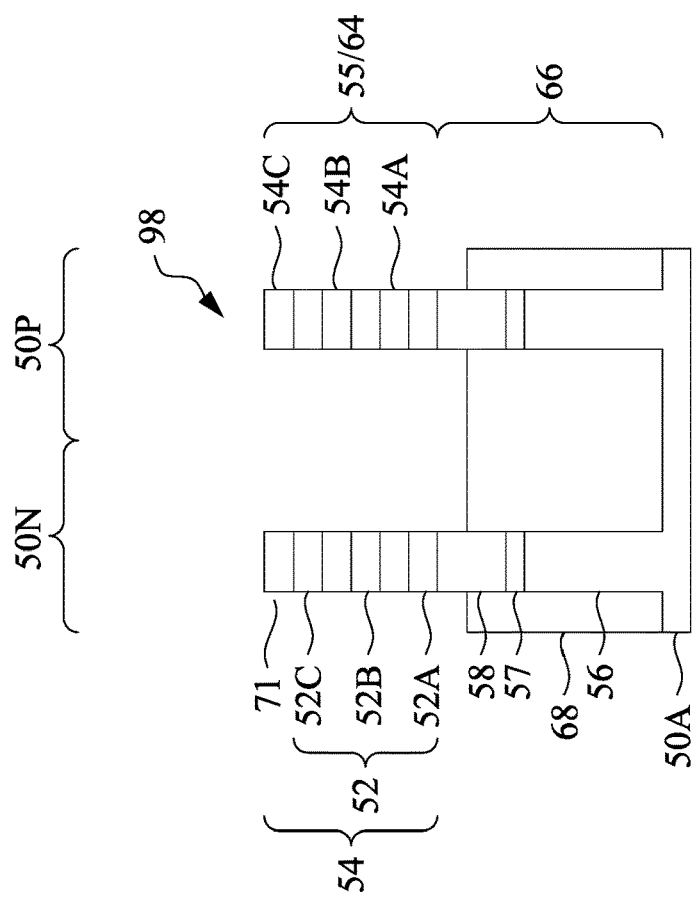
Figure 15C:
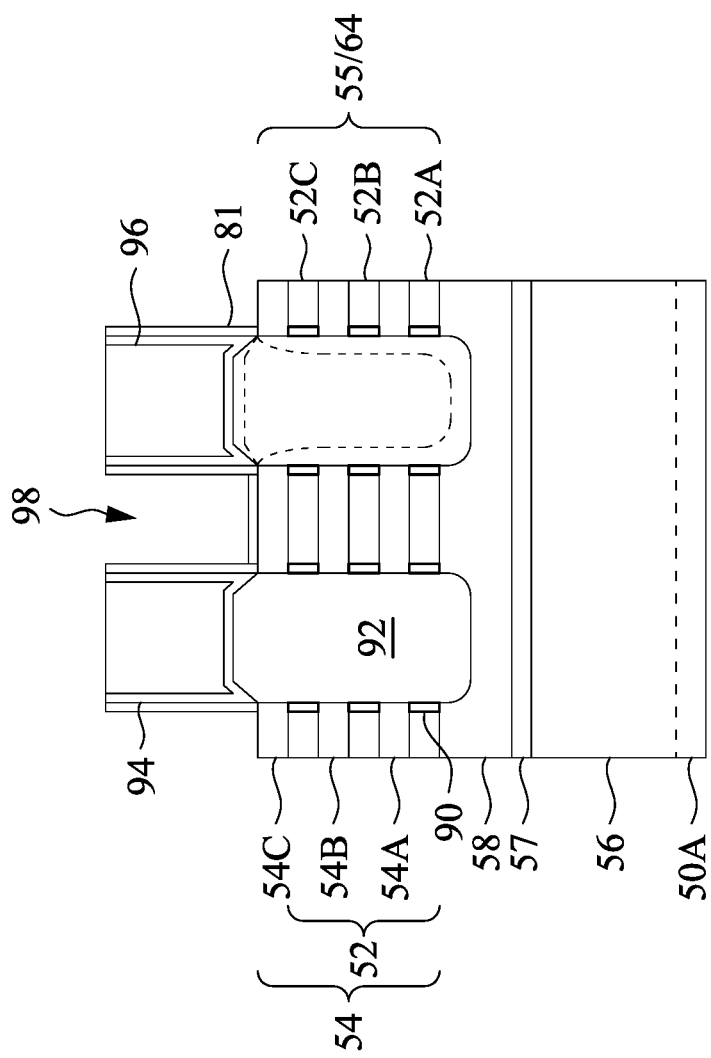

In FIGS. 15A through 15C, the dummy gates 76, and the masks 78 if present, are removed in one or more etching steps to form recesses 98. Portions of the dummy gate dielectrics 71 in the recesses 98 may also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 and/or the dummy gate dielectrics 71 at a faster rate than the first ILD 96, the CESL 94, or the first spacers 81. Each of the recess 98 exposes and/or overlies portions of the nanostructures 55, which act as channel regions in subsequently completed nanostructure FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
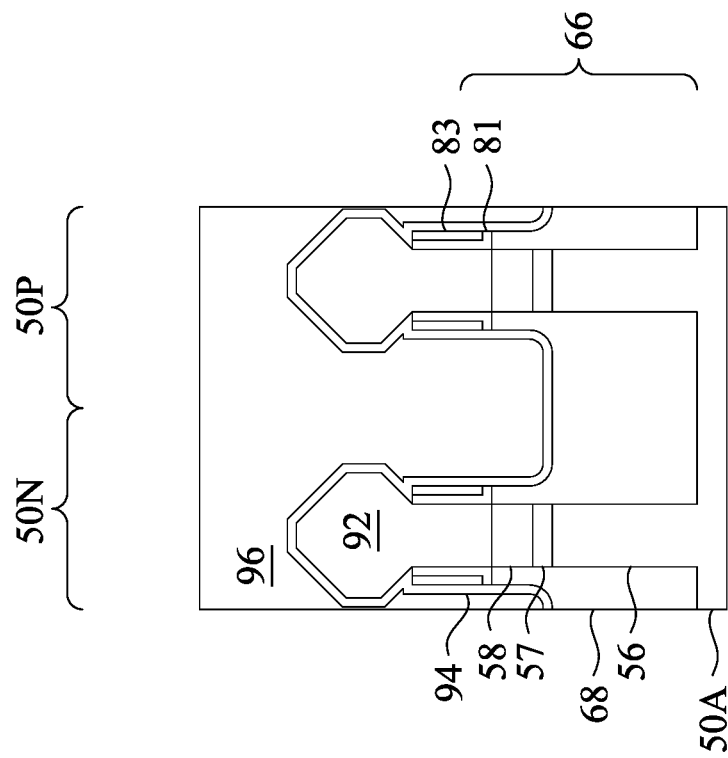
Figure 16A:
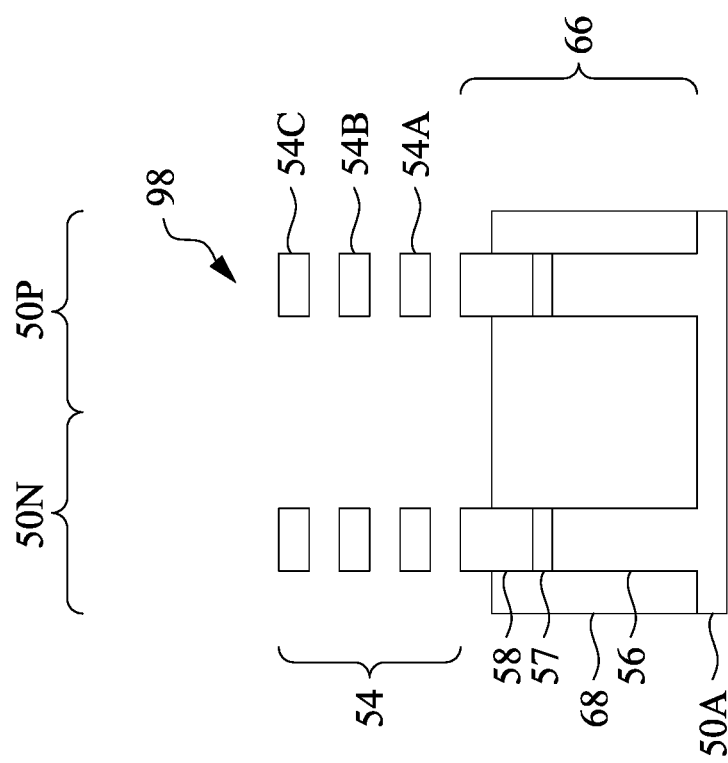
Figure 16C:
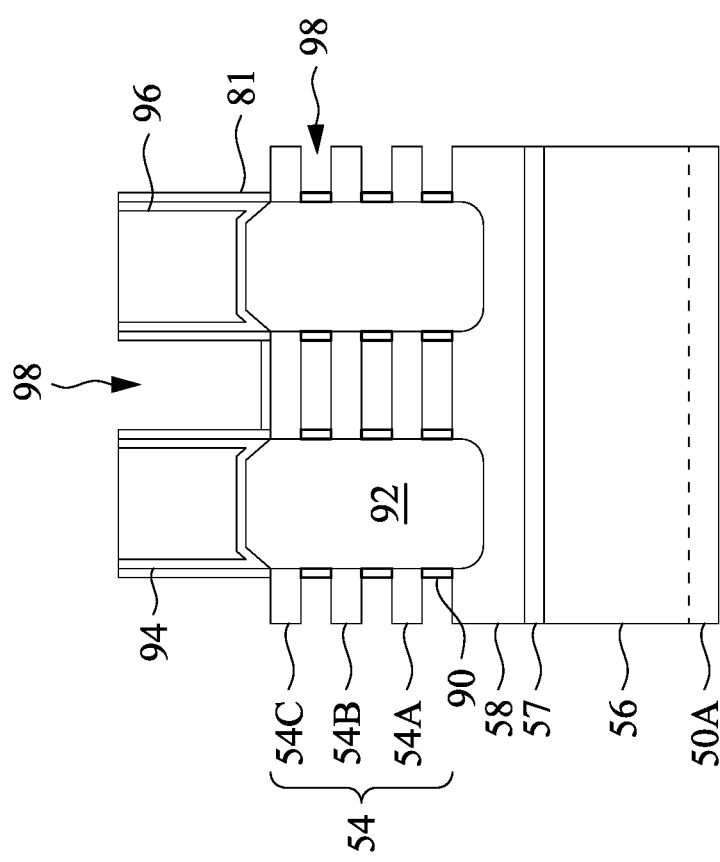

In FIGS. 16A through 16C, the first nanostructures 52 are removed to extend the recesses 98. The first nanostructures 52 may be removed by performing an isotropic etching process, such as wet etching or the like, using etchants which are selective to the materials of the first nanostructures 52, while the second nanostructures 54, the upper fin portions 58, the STI regions 68, the first ILD 96, the CESL 94, and the first spacers 81 remain relatively un-etched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide (NH$_4$OH), or the like may be used to remove the first nanostructures 52.

Figure 17B:
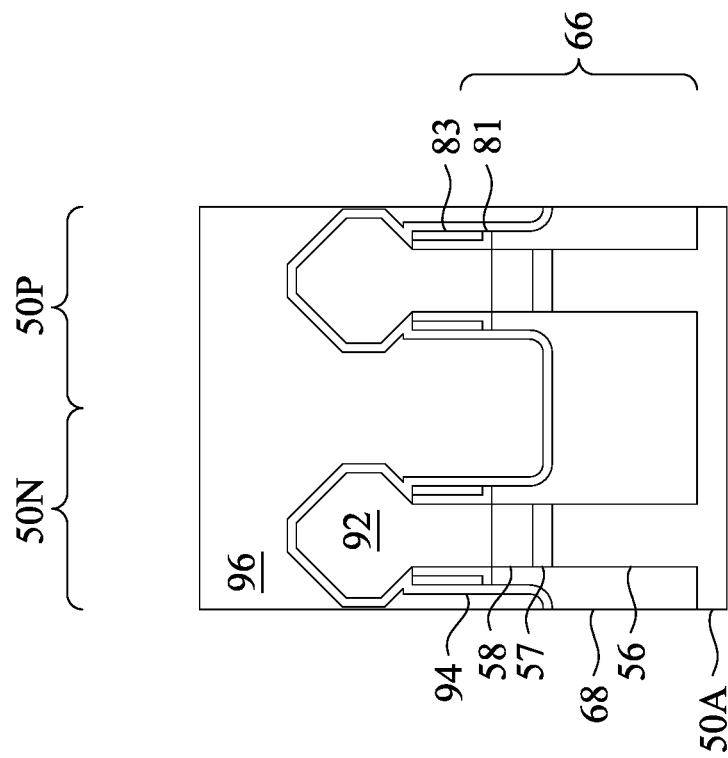
Figure 17A:
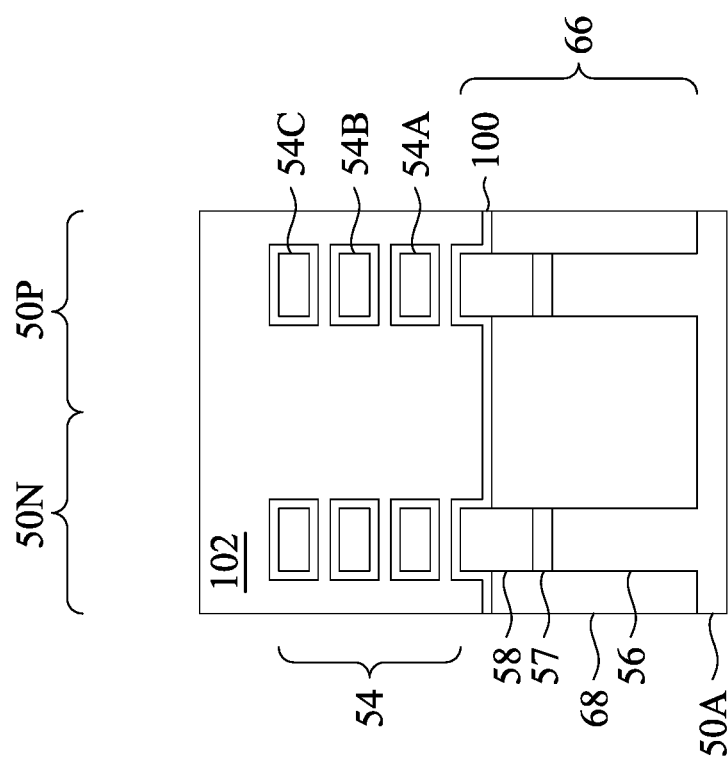
Figure 17C:
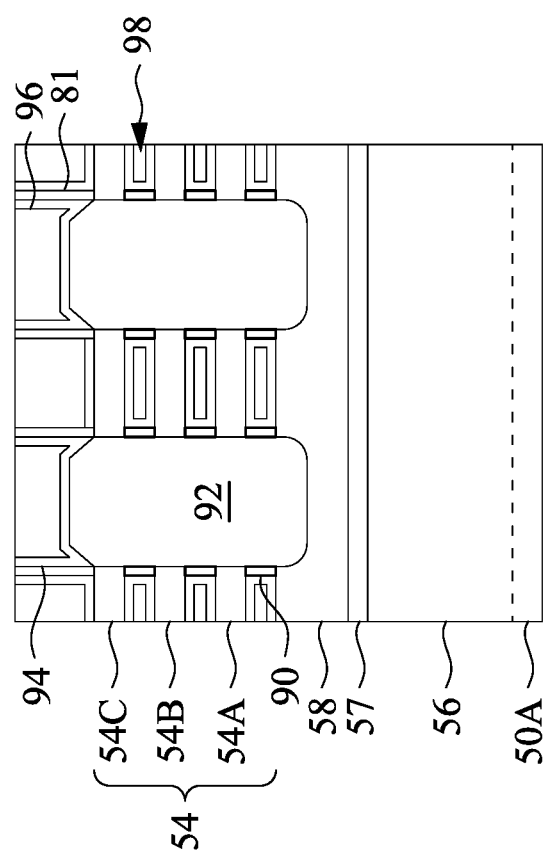

In FIGS. 17A through 17C, gate dielectric layers 100 and gate electrodes 102 are formed for replacement gates. The gate dielectric layers 100 are deposited conformally in the recesses 98. The gate dielectric layers 100 may be formed on top surfaces and side surfaces of the upper fin portions 58 and on top surfaces, side surfaces, and bottom surfaces of the second nanostructures 54. The gate dielectric layers 100 may also be deposited on top surfaces of the first ILD 96, the CESL 94, the first spacers 81, and the STI regions 68 and on side surfaces of the first spacers 81 and the first inner spacers 90.

In some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100 and fill remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single-layer gate electrodes 102 are illustrated in FIGS. 17A and 17C, the gate electrodes 102 may include any number of liner layers, any number of work function tuning layers, and a fill material. Any combination of the layers which make up the gate electrodes 102 may be deposited in the n-type region 50N and the p-type region 50P between adjacent ones of the second nanostructures 54 and between the second nanostructures 54A and the upper fin portions 58.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers. The gate electrodes 102 in each region may be formed by distinct processes, such that the gate electrodes 102 may be different materials and/or have a different number of layers. Various masking steps may be used to mask and expose appropriate regions when using distinct processes.

After the filling of the recesses 98, a planarization process, such as a CMP, may be performed to remove the excess portions of the gate dielectric layers 100 and the gate electrodes 102, which excess portions are over top surfaces of the first ILD 96. The remaining portions of the gate electrodes 102 and the gate dielectric layers 100 form replacement gate structures of the resulting nanostructure FETs. The gate electrodes 102 and the gate dielectric layers 100 may be collectively referred to as "gate structures."

Figure 18B:
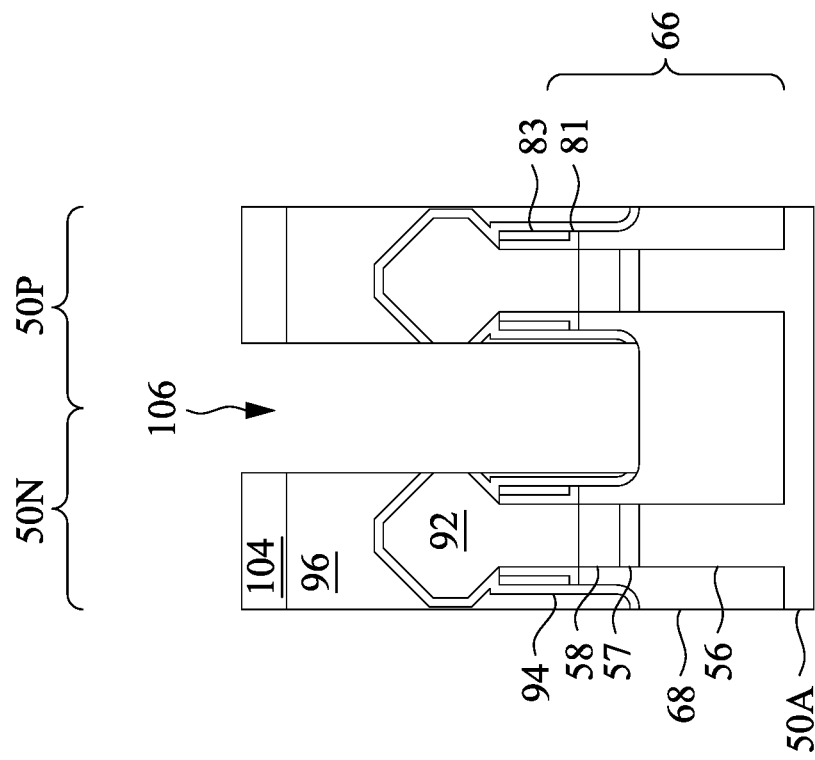
Figure 18A:
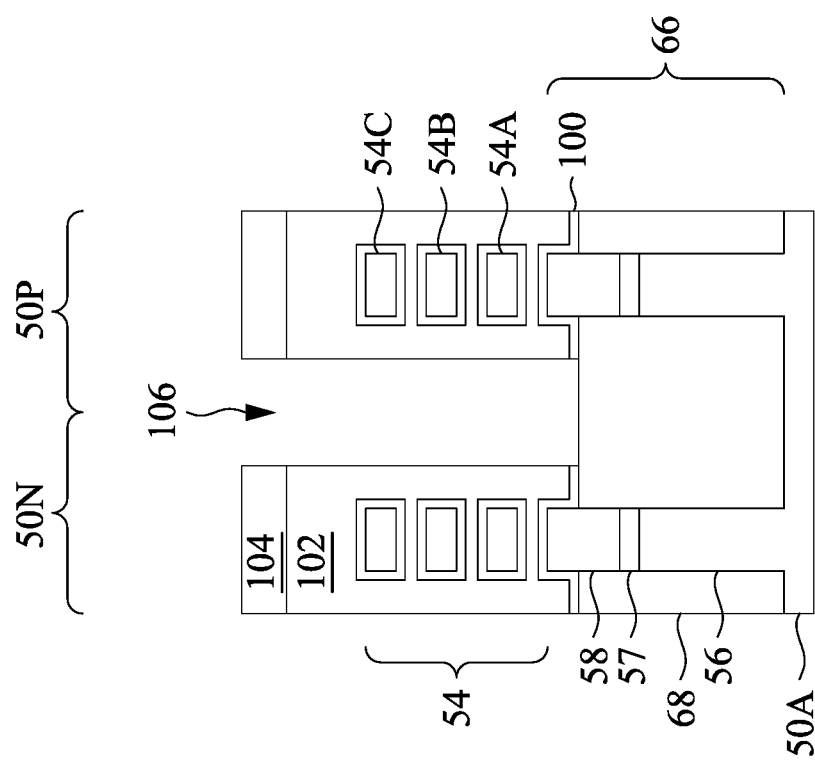
Figure 18C:
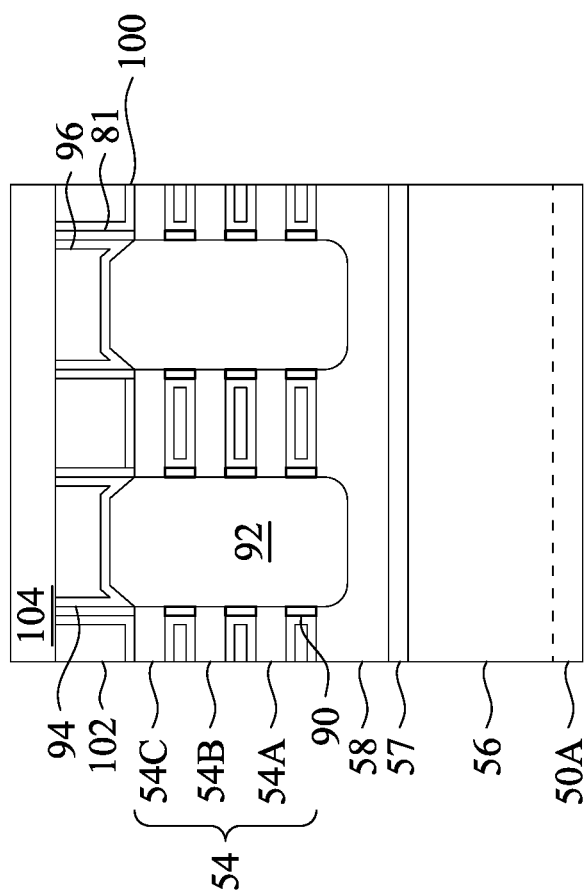

In FIGS. 18A through 18C, a patterned photoresist 104 is formed on the first ILD 96 and is used to form recesses 106 extending through the first ILD 96, the CESL 94, the gate electrodes 102, and the gate dielectric layers 100. As illustrated in FIGS. 18A and 18B, the recesses 106 may expose the STI regions 68. The patterned photoresist 104 may be formed by depositing a photoresist layer (not separately illustrated) over the first ILD 96, the CESL 94, the first spacers 81, the gate electrodes 102, and the gate dielectric layers 100 using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the patterned photoresist 104. The first ILD 96, the CESL 94, the gate electrodes 102, and the gate dielectric layers 100 may be patterned by a suitable etching process, such as an anisotropic etching process, to transfer the pattern of the patterned photoresist 104 to the first ILD 96, the CESL 94, the gate electrodes 102, and the gate dielectric layers 100. In some embodiments, the etching process may include RIE, NBE, the like, or a combination thereof. As illustrated in FIG. 18A, a gate electrode 102 and a gate dielectric layer 100 may be patterned to form a recess 106 exposing a top surface of an STI region 68. As illustrated in FIG. 18B, the first ILD 96 and the CESL 94 may be patterned to form a recess 106 exposing a top surface of an STI region 68. Although side surfaces of the epitaxial source/drain regions 92 adjacent the recess 106 are illustrated as being exposed, in some embodiments, the patterned photoresist 104 and the recess 106 may be provided such that the side surfaces of the epitaxial source/drain regions 92 remain covered by the CESL 94 and/or the first ILD 96. The recesses 106 are illustrated as being formed between epitaxial source/drain regions 92 and between portions of the gate electrodes 102 and the gate dielectric layers 100 in adjacent regions of the nanostructure FETs (e.g., the n-type region 50N and the p-type region 50P). In some embodiments, the recesses 106 may be formed between epitaxial source/drain regions 92 and/or between gate electrodes 102 and gate dielectric layers 100 in the same region of the nanostructure FETs (e.g., between epitaxial source/drain regions 92 and/or between gate electrodes 102 and gate dielectric layers 100 in the n-type region 50N or in the p-type region 50P).

Figure 19B:
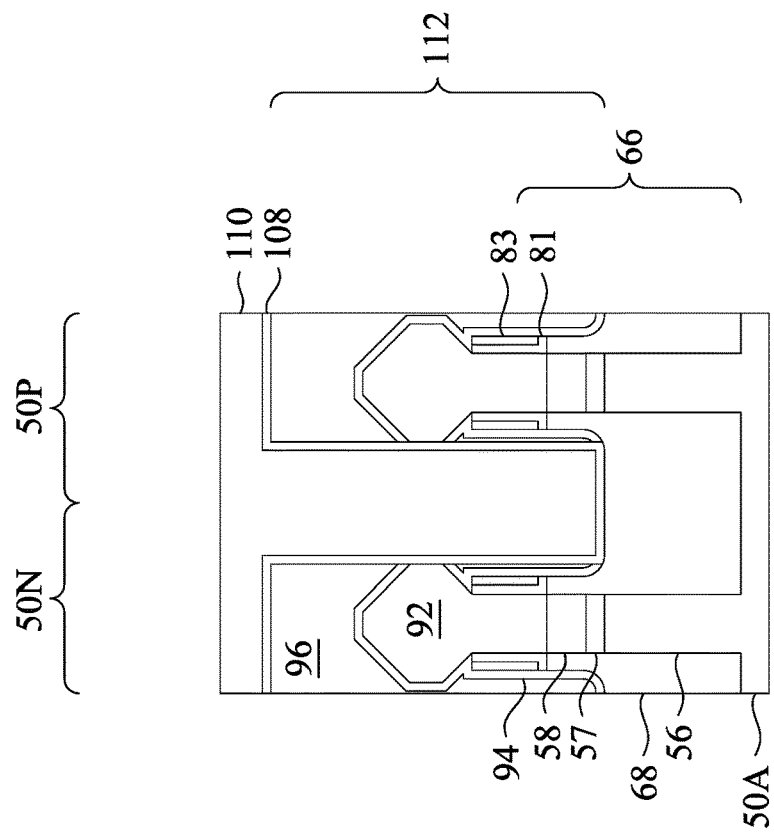
Figure 19A:
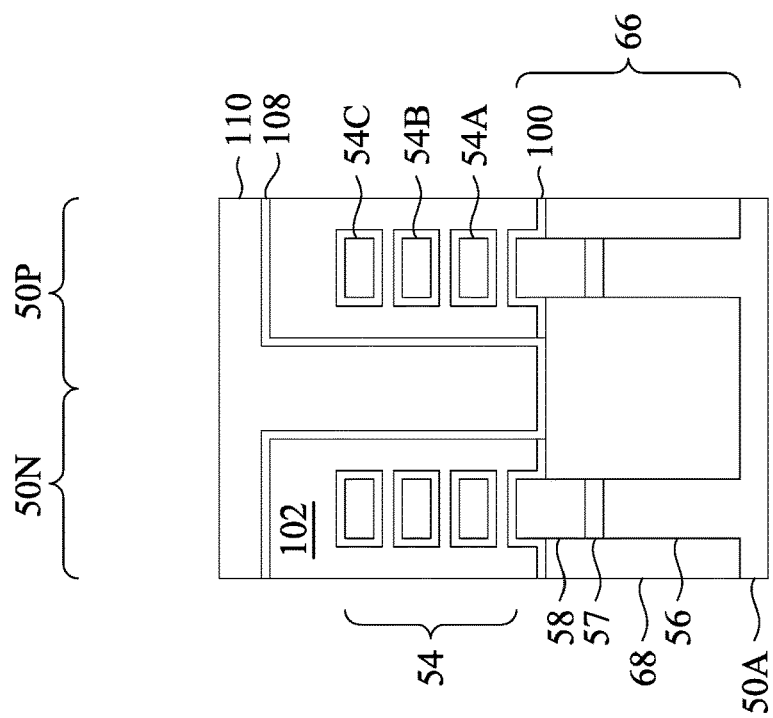
Figure 19C:
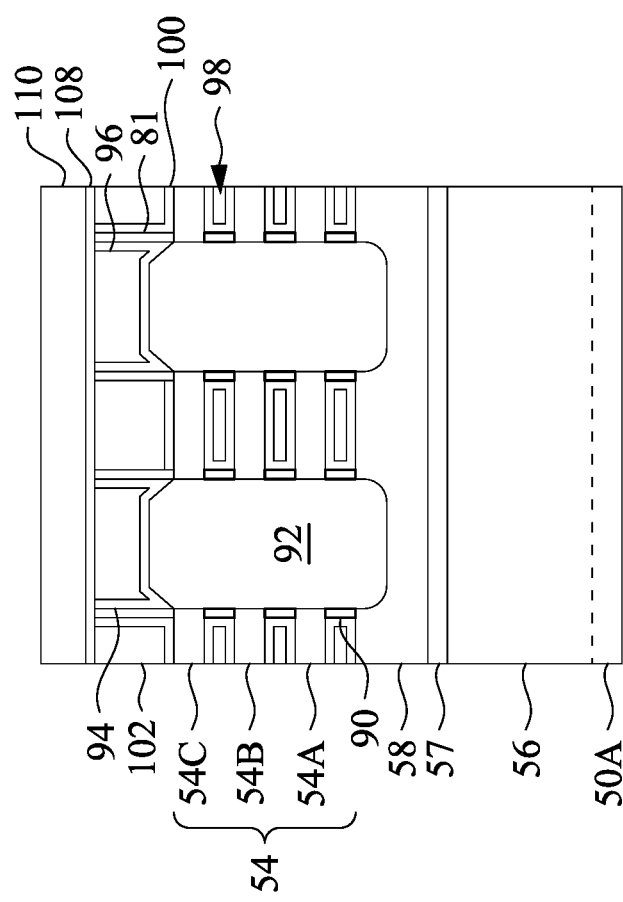
Figure 20B:
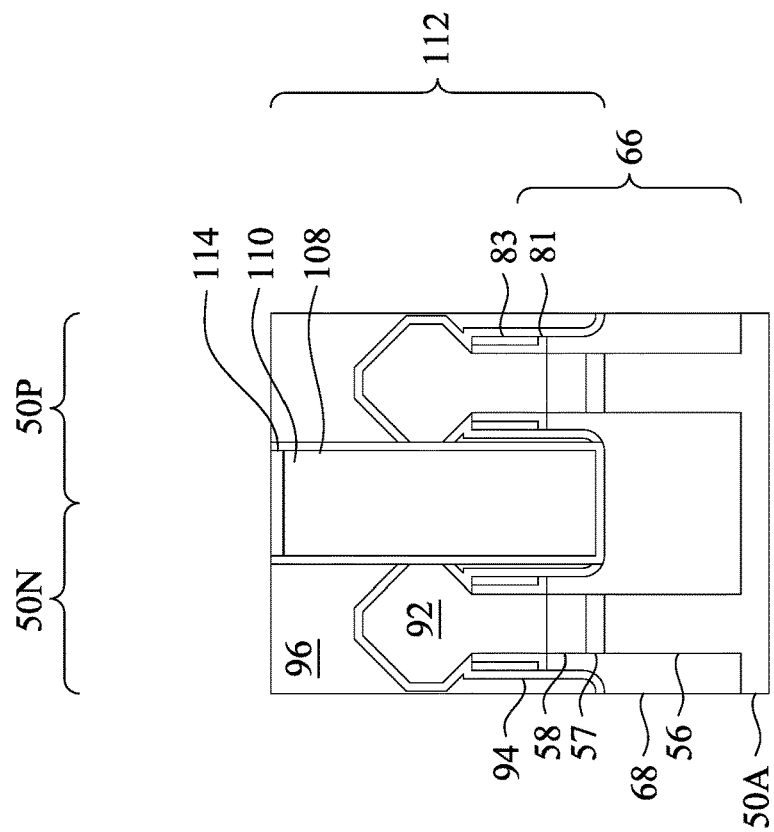
Figure 20A:
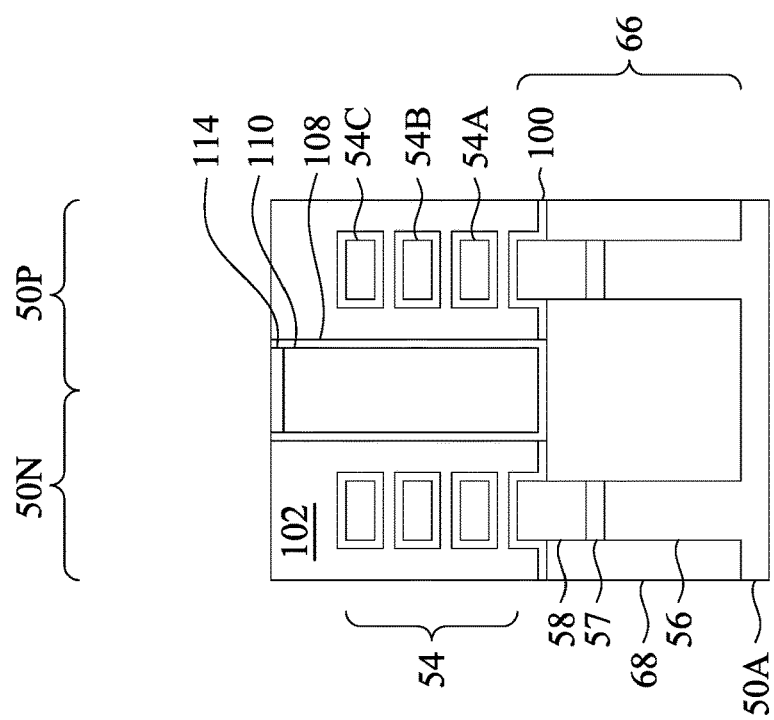
Figure 20C:
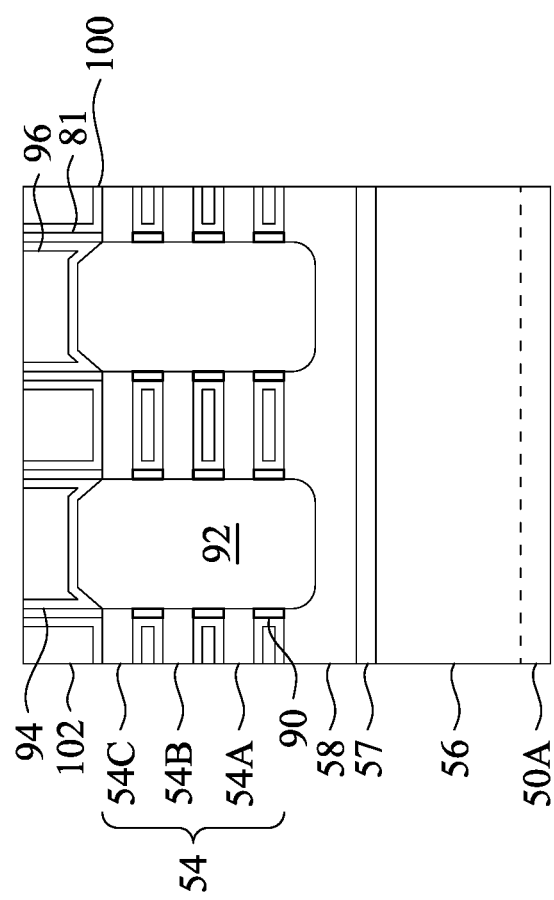
Figure 20D:
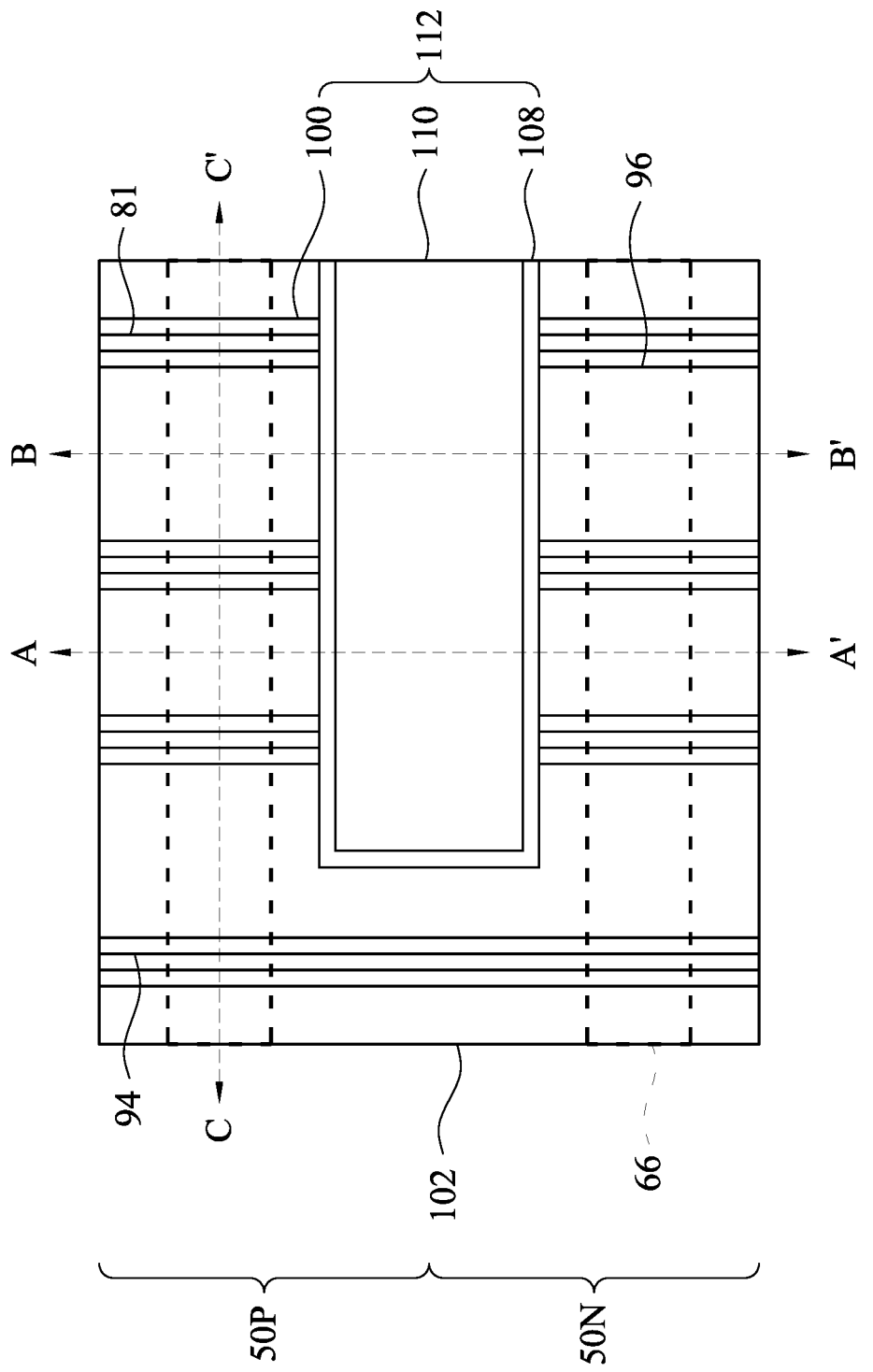

In FIGS. 19A through 19C, the patterned photoresist 104 is removed and backside power vias 112 are formed in the recesses 106. The patterned photoresist 104 may be removed by an acceptable ashing process or the like. Each of the backside power vias 112 includes a liner layer 108 and a conductive fill material 110 on the liner layer 108. The backside power vias 112 may be used to electrically couple the epitaxial source/drain regions 92 to a backside interconnect structure formed on a backside of the nanostructure FETs.

The liner layer 108 is deposited conformally in the recesses 106. The liner layer 108 may be formed on top surfaces of the STI regions 68, the first ILD 96, the CESL 94, the first spacers 81, the gate electrodes 102, and the gate dielectric layers 100 and side surfaces of the CESL 94, the first ILD 96, the epitaxial source/drain regions 92, the gate electrodes 102, and the gate dielectric layers 100. The liner layer 108 may be deposited by ALD, CVD, PECVD, or the like. In some embodiments, the liner layer 108 may include boron nitride, such as amorphous boron nitride (a-BN), hexagonal boron nitride (h-BN), or the like. Forming the liner layer 108 from boron nitride allows the liner layer 108 to electrically isolate the conductive fill material 110 from adjacent materials and/or structures, and prevents diffusion of materials from the conductive fill material 110 to the adjacent materials and/or structures. This allows for a single layer to be used for the liner layer 108, as opposed to multiple layers being used, which reduces processing time, reduces costs, reduces device defects, reduces feature size, and increases feature density for backside power vias 112 including the liner layer 108 and the conductive fill material 110. Boron nitride has an improved breakdown voltage and lower capacitance than alternative materials, which provides for reduced defects, lower RC delay, and improved performance in devices including the backside power vias 112. Boron nitride is a good diffusion barrier for copper, which may be used for the conductive fill material 110, at an operating temperature in a range from about 300° C. to about 400° C. Providing the liner layer 108 formed from boron nitride, which is a metal diffusion barrier, allows for a greater variety of materials to be used for the conductive fill material 110. For example, the conductive fill material 110 may be formed from copper, which has a high electrical conductivity. This allows for the backside power vias 112 to have reduced electrical resistance and improved device performance.

Precursors used to form the liner layer 108 may include a boron-containing precursor, such as ammonia borane (BNH6), borazine (B3N3H6), borane (BH3), combinations thereof, or the like; and a nitrogen-containing precursor, such as nitrogen (N2), ammonia (NH3), a combination of nitrogen and hydrogen (H2), combinations thereof, or the like. The liner layer 108 may be deposited by flowing the boron-containing precursor and the nitrogen-containing precursor into a reaction chamber and activating a plasma in the reaction chamber. The boron-containing precursors may be relatively small, light compounds with high diffusion coefficients such that the liner layer 108 is deposited as a highly conformal layer. In some embodiments, this deposition process may deposit the liner layer 108 as amorphous boron nitride. In embodiments in which the liner layer 108 includes amorphous boron nitride, the liner layer 108 may have no major peaks as measured by Raman shift. In embodiments in which the liner layer 108 includes amorphous boron nitride, a ratio of nitrogen atoms in the liner layer 108 to boron atoms in the liner layer 108 may be in a range from about 0.9 to about 1.1. A hydrogen concentration in the liner layer 108 may be in a range from about 1.0 atomic wt. % to about 8.0 atomic wt. %. Providing a ratio of nitrogen atoms to boron atoms in the liner layer 108 greater than the prescribed range or a hydrogen concentration greater less than the prescribed range may increase leakage through the liner layer 108. Providing a ratio of nitrogen atoms to boron atoms in the liner layer 108 less than the prescribed range or a hydrogen concentration greater than the prescribed range may decrease the stability of the liner layer 108.

A post-deposition treatment may be performed to convert the deposited amorphous boron nitride to hexagonal boron nitride. In some embodiments, a thermal anneal at a temperature of greater than about 400° C. may be used to convert the amorphous boron nitride to hexagonal boron nitride. In some embodiments, a plasma process may be used to convert the amorphous boron nitride to hexagonal boron nitride. For example, in some embodiments, after the liner layer 108 is deposited, a precursor such as nitrogen (N2), ammonia (NH3), a combination of nitrogen and hydrogen (H2), helium (He), argon (Ar), combinations thereof, or the like, may be flowed over the liner layer 108 and a plasma may be activated in the reaction chamber to convert the deposited amorphous boron nitride to hexagonal boron nitride. The plasma process may be performed with a plasma power in a range from about 1,000 W to about 4,500 W. In embodiments in which the liner layer 108 includes hexagonal boron nitride, the liner layer 108 may have major peaks at about 1560 cm-1 to about 1590 cm-1 and at about 2600 cm-1 to about 2680 cm-1, as measured by Raman shift. In embodiments in which the liner layer 108 includes hexagonal boron nitride, a ratio of nitrogen atoms in the liner layer 108 to boron atoms in the liner layer 108 may be in a range from about 1.0 to about 1.2. A hydrogen concentration in the liner layer 108 may be less than about 8.0 atomic wt. %. Providing a ratio of nitrogen atoms to boron atoms in the liner layer 108 greater than the prescribed range or a hydrogen concentration greater than the prescribed range may increase leakage through the liner layer 108. Providing a ratio of nitrogen atoms to boron atoms in the liner layer 108 less than the prescribed range or a hydrogen concentration greater less than the prescribed range may decrease the stability of the liner layer 108. Reducing the hydrogen concentration in the liner layer 108 improves the stability of the liner layer 108. Converting the material of the liner layer 108 from amorphous boron nitride to hexagonal boron nitride improves the thermal conductivity of the liner layer 108, which improves heat dissipation through the backside power vias 112.

The liner layer 108 may have a thickness in a range from about 0.5 nm to about 50 nm. Providing the liner layer 108 with the prescribed thickness provides for sufficient material to provide the benefits of electrical isolation and a metal diffusion barrier, while minimizing the thickness of the liner layer 108. This allows for smaller feature size and greater density of the backside power vias 112, while providing isolation between the backside power vias 112 and adjacent structures.

The conductive fill material 110 is deposited on the liner layer 108. The conductive fill material 110 may be formed by depositing a seed layer (not separately illustrated) and electroplating a remainder of the conductive fill material 110 over the seed layer and filling the recesses 106. The conductive fill material 110 may include copper, cobalt, tungsten, combinations thereof, or the like. The seed layer may include copper, a copper alloy, or the like. As illustrated in FIGS. 19A through 19C, the conductive fill material 110 may be formed in direct contact with the liner layer 108. The liner layer 108 acts as a metal diffusion barrier such that a greater variety of materials may be used for the conductive fill material 110. More specifically, materials such as copper may be used for the conductive fill material 110, which reduces electrical resistance of the conductive fill material 110, reduces RC delay, and results in improved device performance.

In FIGS. 20A through 20D, the backside power vias 112 are etched back and via caps 114 are formed over the backside power vias 112. FIG. 20D illustrates a top-down view in which the via caps 114 are omitted. In some embodiments, the backside power vias 112 may be etched back by a planarization process, such as a CMP, an etch-back process, combinations thereof, or the like. The planarization process may be followed by an etch-back process to recess top surfaces of the conductive fill material 110 below top surfaces of the liner layer 108, the first ILD 96, the CESL 94, the first spacers 81, the gate dielectric layers 100, and the gate electrodes 102.

The via caps 114 are formed on the conductive fill material 110 in recesses formed by etching back the conductive fill material 110. The via caps 114 may extend between opposite side surfaces of the liner layer 108. In some embodiments, the liner layer 108 may also be etched back and the via caps 114 may extend between opposite surfaces of the gate electrodes 102 and the first ILD 96. The via caps 114 may include conductive barrier materials, such as tantalum nitride, cobalt, combinations or multiple layers thereof, or the like. The via caps 114 may be diffusion barriers, which prevent diffusion from the conductive fill material 110. Source/drain contacts may be subsequently formed on the via caps 114, and as such, the via caps 114 may be formed of electrically conductive materials. The via caps 114 may be formed by a process such as CVD, ALD, PVD, or the like, followed by a planarization process to remove excess portions of the via caps 114 extending over the liner layer 108, the first ILD 96, the CESL 94, the first spacers 81, the gate electrodes 102, and the gate dielectric layers 100.

As illustrated in FIG. 20D, the backside power vias 112 may be formed between adjacent fins 66. The backside power vias 112 may extend in a direction parallel to the fins 66 and perpendicular to the gate electrodes 102. The backside power vias 112 may extend through adjacent gate electrodes 102 and portions of the first ILD 96 adjacent the gate electrodes 102. Although the backside power vias 112 are illustrated as being rectangular in the top-down view, in some embodiments, the backside power vias 112 may be rounded, or may have any other suitable shape.

Figure 21B:
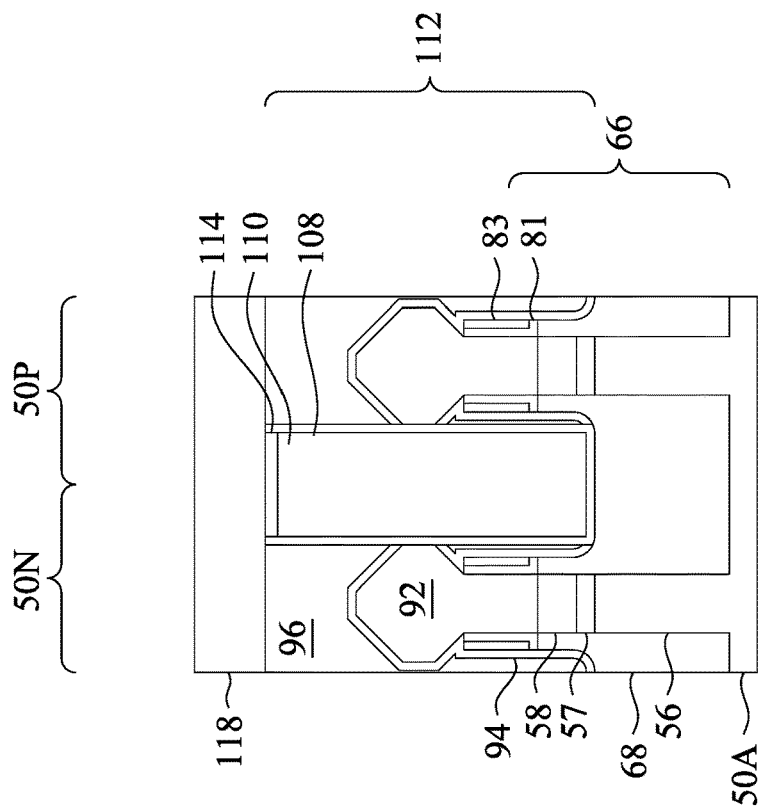
Figure 21A:
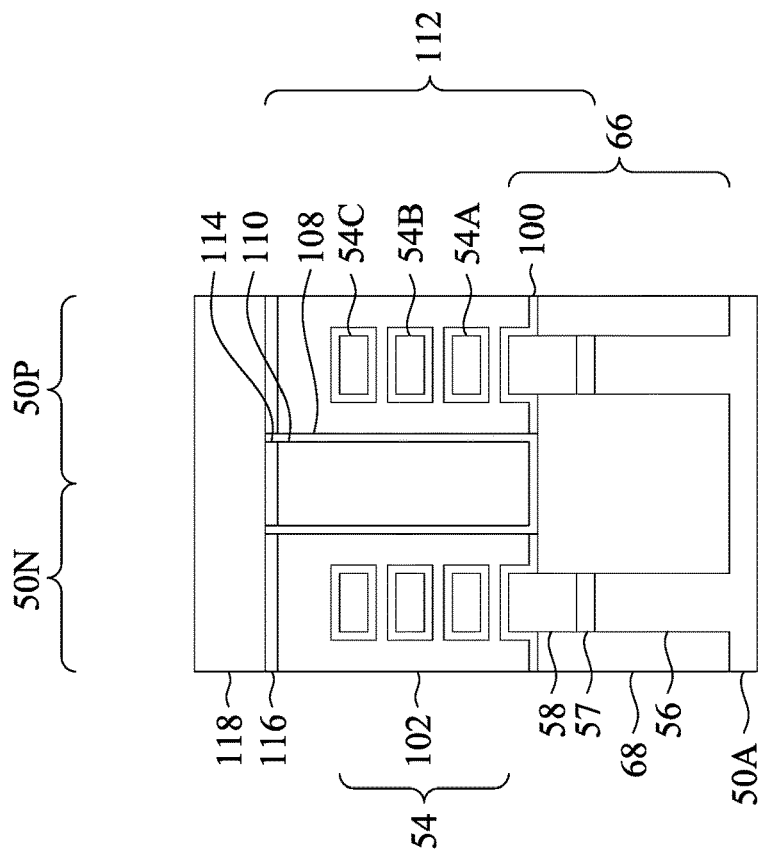
Figure 21C:
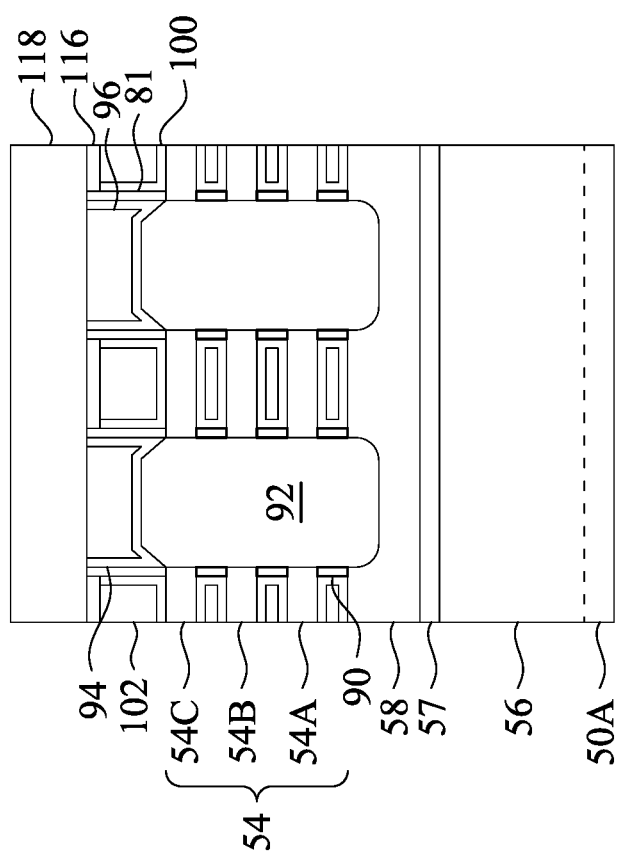

In FIGS. 21A through 21C, the gate structures (including the gate dielectric layers 100 and the gate electrodes 102) are recessed, so that recesses are formed directly over the gate structures and between opposing portions of first spacers 81. Gate caps 116 comprising one or more layers of dielectric material, such as silicon nitride, silicon oxynitride, or the like, are filled in the recesses, followed by a planarization process to remove excess portions of the dielectric material extending over the first ILD 96, the CESL 94, the first spacers 81, and the via caps 114. Subsequently formed gate contacts (such as the gate contacts 129, discussed below with respect to FIGS. 23A through 23C) penetrate through the gate caps 116 to contact the top surfaces of the gate electrodes 102.

As further illustrated by FIGS. 21A through 21C, a second ILD 118 is deposited over the first ILD 96, the gate caps 116, the via caps 114, the first spacers 81, and the CESL 94. In some embodiments, the second ILD 118 is a flowable film formed by FCVD. In some embodiments, the second ILD 118 is formed of a dielectric material such as PSG, BSG, BPSG, USG, or the like, and may be deposited by any suitable method, such as CVD, PECVD, or the like.

Figure 22B:
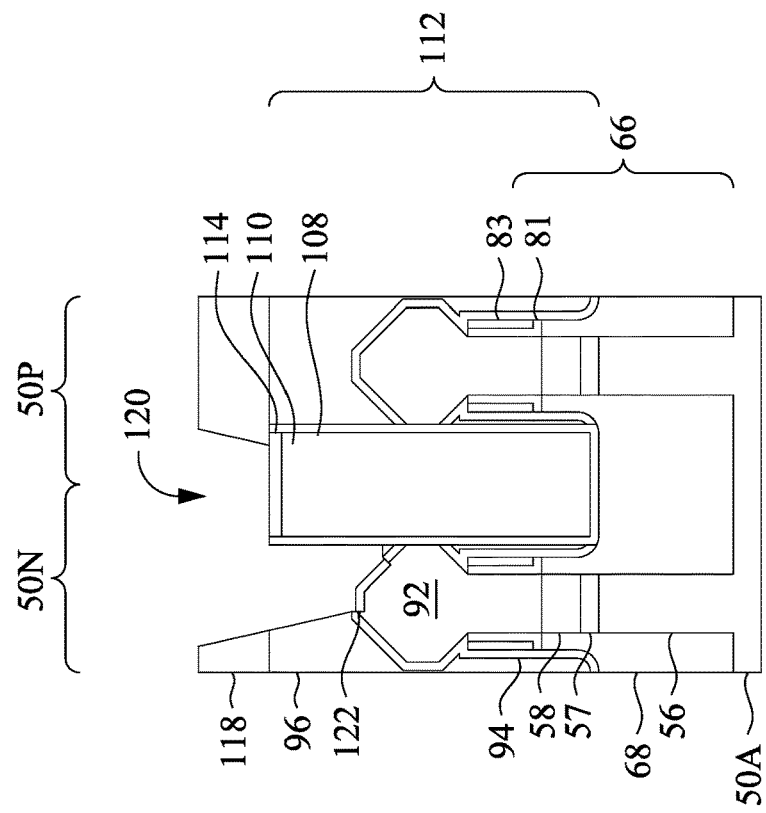
Figure 22A:
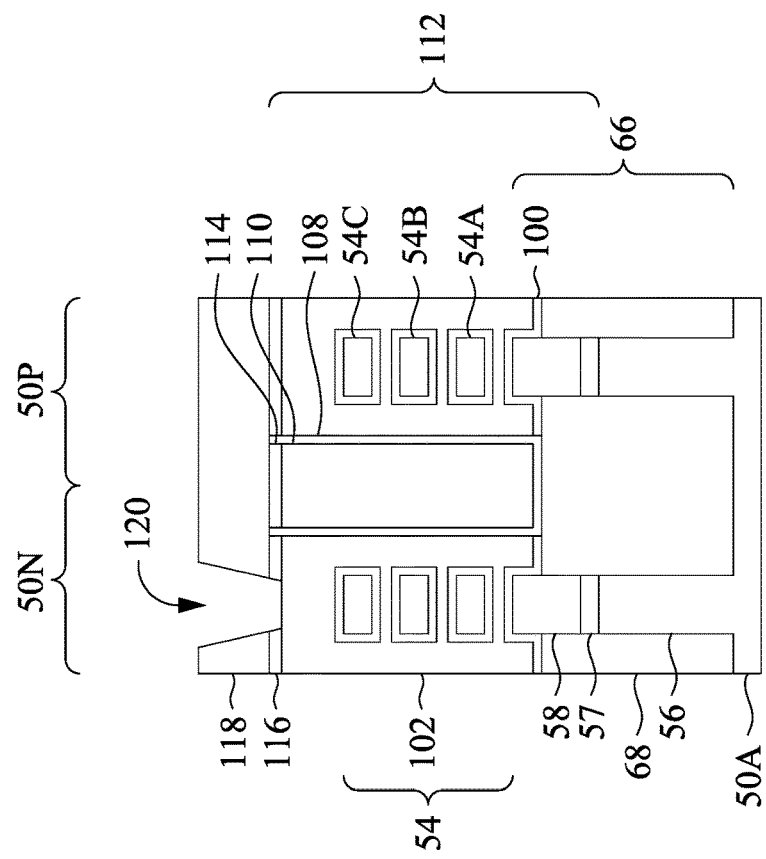
Figure 22C:
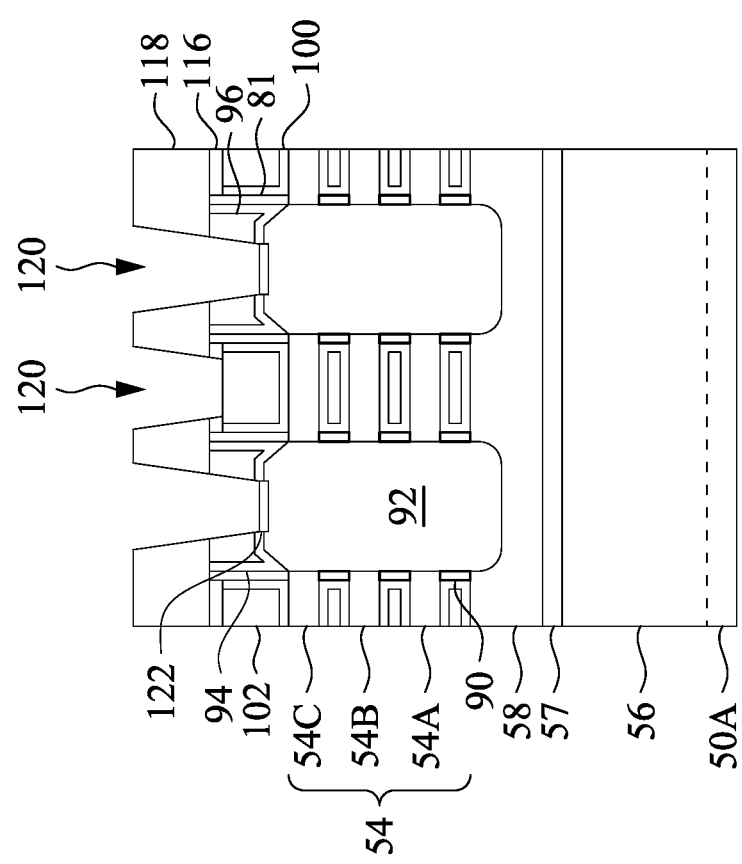

In FIGS. 22A through 22C, the second ILD 118, the first ILD 96, the CESL 94, and the gate caps 116 are etched to form recesses 120 exposing surfaces of the epitaxial source/drain regions 92, the via caps 114, and/or the gate structures. The recesses 120 may be formed by etching using an anisotropic etching process, such as RIE, NBE, or the like. In some embodiments, the recesses 120 may be etched through the second ILD 118 and the first ILD 96 using a first etching process; may be etched through the gate caps 114 using a second etching process; and may be etched through the CESL 94 using a third etching process. A mask, such as a photoresist, may be formed and patterned over the second ILD 118 to mask portions of the second ILD 118 from the etching processes. In some embodiments, the etching processes may over-etch, and the recesses 120 may extend into the epitaxial source/drain regions 92, the via caps 114, and/or the gate structures. Bottom surfaces of the recesses 120 may be level with (e.g., at a same level, or having a same distance from the core substrate 50A), or lower than (e.g., closer to the core substrate 50A) top surfaces of the epitaxial source/drain regions 92, the via caps 114, and/or the gate structures. Although FIG. 22C illustrates the recesses 120 as exposing the epitaxial source/drain regions 92 and the gate structures in a same cross-section, in some embodiments, the epitaxial source/drain regions 92 and the gate structures may be exposed in different cross-sections, thereby reducing the risk of shorting subsequently formed contacts.

After the recesses 120 are formed, silicide regions 122 are formed over the epitaxial source/drain regions 92. In some embodiments, the silicide regions 122 are formed by first depositing a metal (not separately illustrated) capable of reacting with the semiconductor materials of the underlying epitaxial source/drain regions 92 (e.g., silicon, silicon germanium, germanium) to form silicide or germanide regions over the exposed portions of the epitaxial source/drain regions 92. The metal may include nickel, cobalt, titanium, tantalum, platinum, tungsten, other noble metals, other refractory metals, rare earth metals or their alloys. After the metal is deposited, a thermal anneal process is performed to form the silicide regions 122. Un-reacted portions of the metal are then removed, e.g., by an etching process. Although the silicide regions 122 are referred to as silicide regions, the silicide regions 122 may be germanide regions, silicon germanide regions (e.g., regions comprising silicide and germanide), or the like. In some embodiments, the silicide regions 122 include TiSi having thicknesses in a range from about 2 nm to about 10 nm.

Figure 23B:
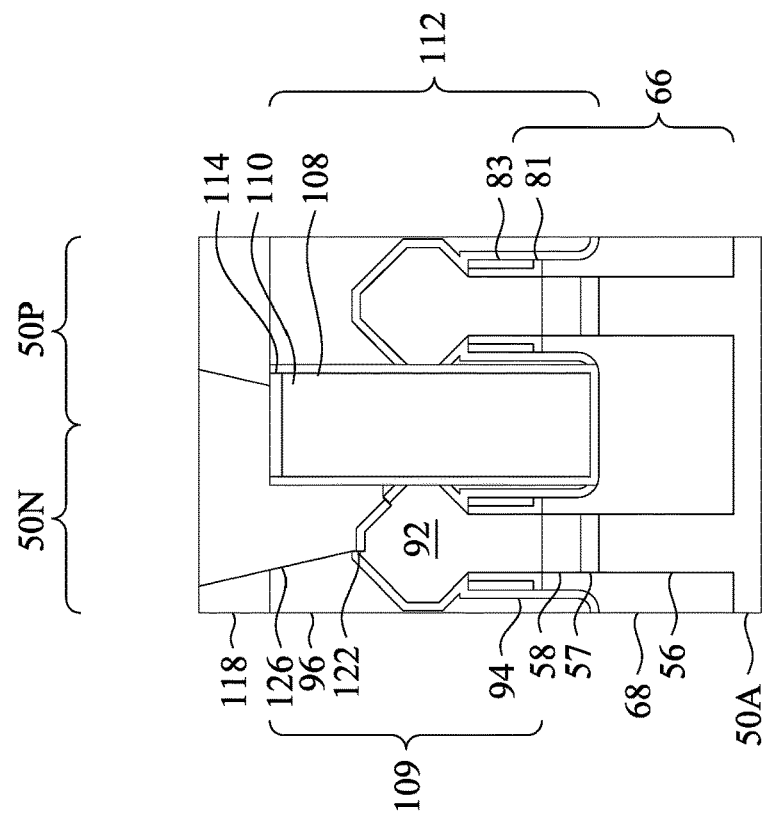
Figure 23A:
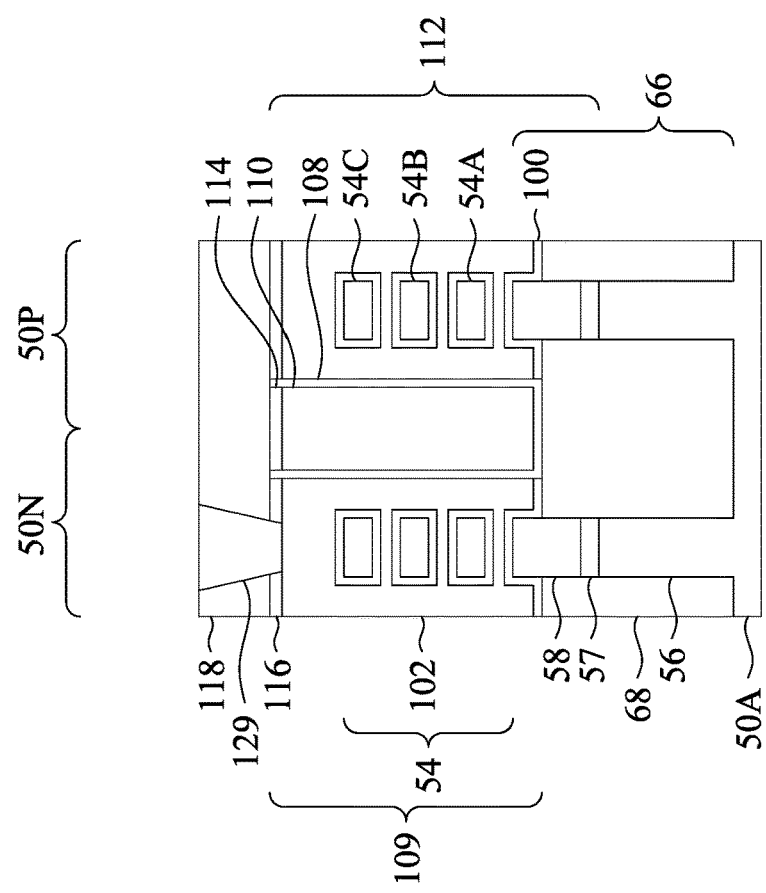
Figure 23C:
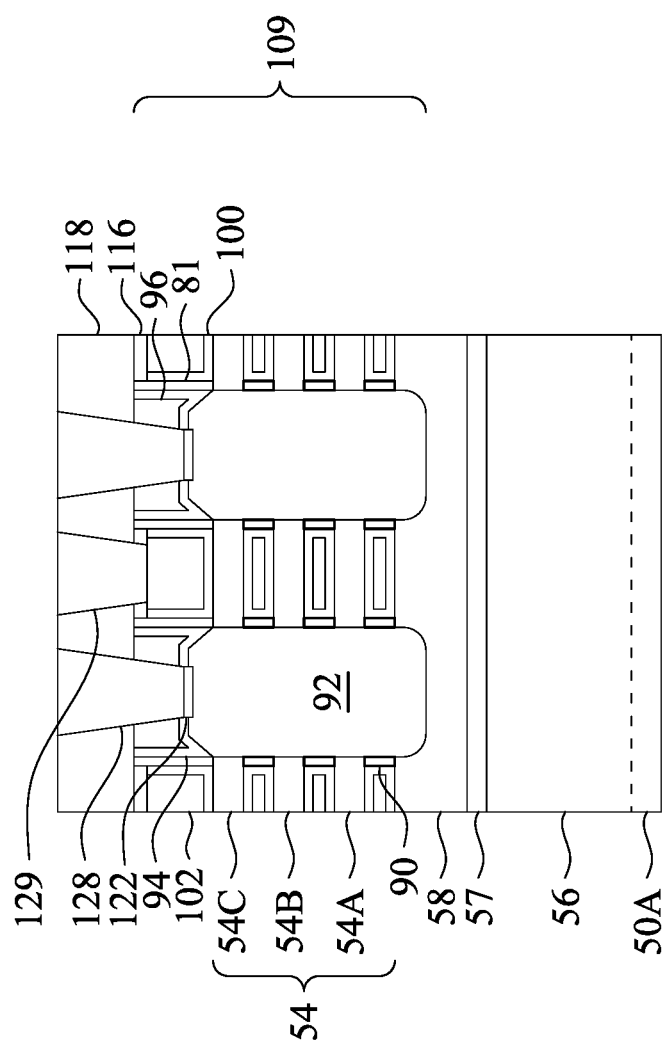

In FIGS. 23A through 23C, first source/drain contacts 126, second source/drain contacts 128, and gate contacts 129 (also referred to as contact plugs) are formed in the recesses 120. The first source/drain contacts 126, the second source/drain contacts 128, and the gate contacts 129 may each comprise one or more layers, such as barrier layers, diffusion layers, and fill materials. For example, in some embodiments, the first source/drain contacts 126, the second source/drain contacts 128, and the gate contacts 129 each include a barrier layer and a conductive material, and are each electrically coupled to an underlying conductive feature (e.g., a gate electrode 102, an epitaxial source/drain region 92, and/or a backside power via 112). The first source/drain contacts 126 are electrically coupled to the epitaxial source/drain regions 92 through the silicide regions 122 and are electrically coupled to the backside power vias 112 through the via caps 114. The second source/drain contacts 128 are electrically coupled to the epitaxial source/drain regions 92 through the silicide regions 122. The gate contacts 129 are electrically coupled to the gate electrodes 102. The barrier layers may include titanium, titanium nitride, tantalum, tantalum nitride, or the like. The conductive materials may be copper, a copper alloy, silver, gold, tungsten, cobalt, aluminum, nickel, or the like. A planarization process, such as a CMP, may be performed to remove excess materials from surfaces of the second ILD 118.

The epitaxial source/drain regions 92, the second nanostructures 54, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 130, discussed below with respect to FIGS. 24A through 24C) being formed over a front-side thereof and a second interconnect structure (such as the backside interconnect structure 170, discussed below with respect to FIGS. 27A through 27C) being formed over a backside thereof. Although the device layer is described as having nanostructure FETs, other embodiments may include a device layer having different types of transistors (e.g., planar FETs, FinFETs, thin film transistors (TFTs), or the like).

Although FIGS. 23A through 23C illustrate a second source/drain contact 128 extending to each of the epitaxial source/drain regions 92, the second source/drain contacts 128 may be omitted from certain ones of the epitaxial source/drain regions 92. For example, as explained in greater detail below, conductive features (e.g., backside lines, vias, or power rails) may be subsequently electrically coupled to one or more of the epitaxial source/drain regions 92 through the backside power vias 112 and the first source/drain contacts 126. For these particular epitaxial source/drain regions 92, the second source/drain contacts 128 may be omitted or may be dummy contacts that are not electrically connected to any overlying conductive lines (such as the conductive features 134, discussed below with respect to FIGS. 24A through 24C).

FIGS. 24A through 27C illustrate intermediate steps of forming front-side interconnect structures 130 (illustrated in FIGS. 24A through 24C) and backside interconnect structures 170 (illustrated in FIGS. 27A through 27C) on the transistor structures 109. The front-side interconnect structures 130 and the backside interconnect structures 170 may each comprise conductive features that are electrically coupled to the nanostructure FETs. FIGS. 24A, 25A, 26A, and 27A illustrate reference cross-section A-A' illustrated in FIG. 1. FIGS. 24B, 25B, 26B, and 27B illustrate reference cross-section B-B' illustrated in FIG. 1. FIGS. 24C, 25C, 26C, and 27C illustrate reference cross-section C-C' illustrated in FIG. 1. The process steps described in FIGS. 24C, 25C, 26C, and 27C may be applied to both the n-type region 50N and the p-type region 50P. As noted above, back-side conductive features (e.g., backside vias, lines, or power rails) may be connected to one or more of the epitaxial source/drain regions 92. As such, the second source/drain contacts 128 may be optionally omitted from the epitaxial source/drain regions 92.

Figure 24B:
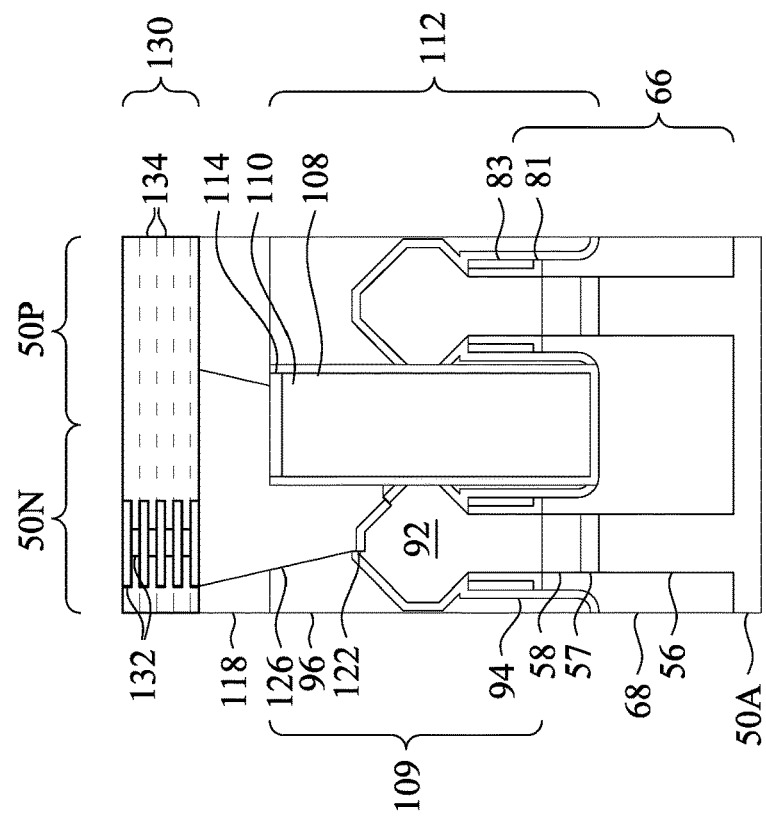
Figure 24A:
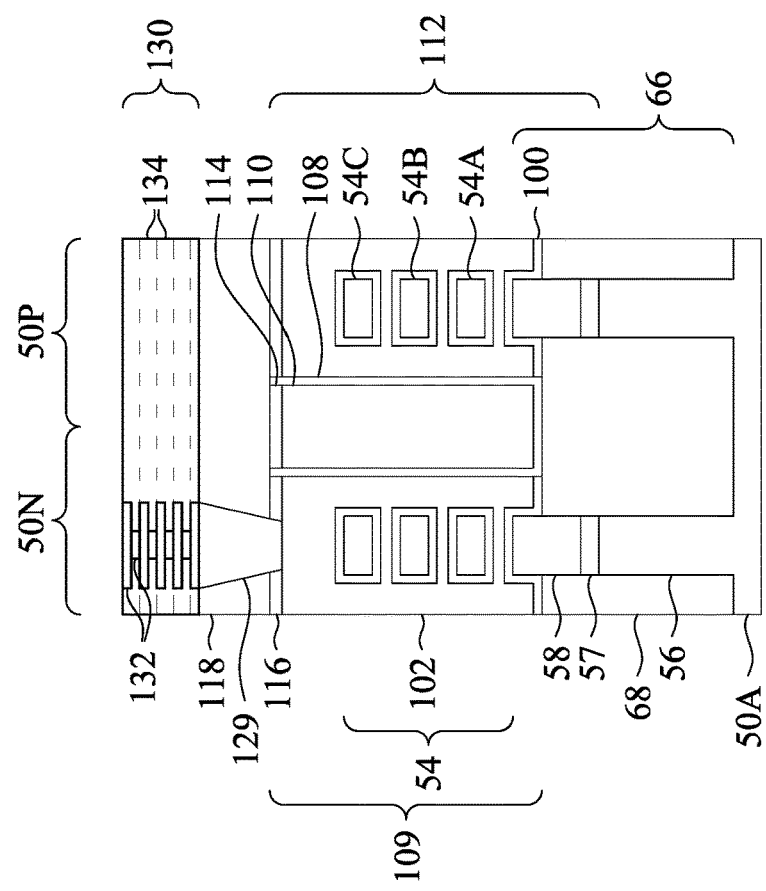
Figure 24C:
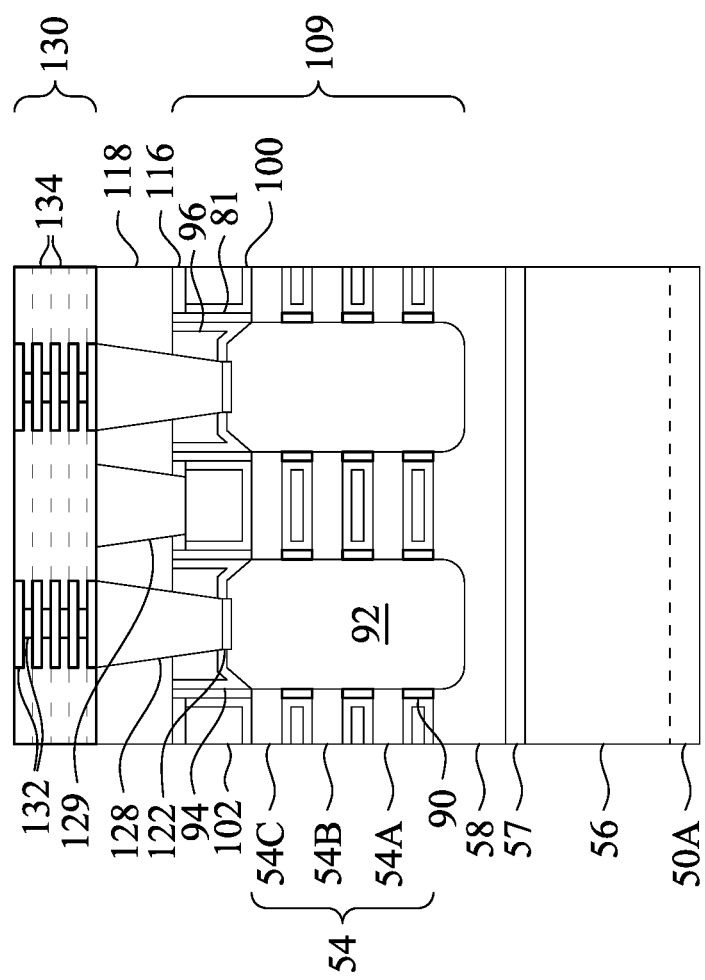

In FIGS. 24A through 24C, a front-side interconnect structure 130 is formed on the second ILD 118. The front-side interconnect structure 130 may be referred to as a front-side interconnect structure because it is formed on a front-side of the transistor structures 109 (e.g., a side of the transistor structures 109 on which active devices are formed).

The front-side interconnect structure 130 may comprise one or more layers of conductive features 134 formed in one or more stacked dielectric layers 132. Each of the stacked dielectric layers 132 may comprise a dielectric material, such as a low-k dielectric material, an extra low-k (ELK) dielectric material, or the like. The dielectric layers 132 may be deposited using an appropriate process, such as, CVD, ALD, PVD, PECVD, or the like.

The conductive features 134 may comprise conductive lines and conductive vias interconnecting the layers of conductive lines. The conductive vias may extend through respective ones of the dielectric layers 132 to provide vertical connections between layers of the conductive lines. The conductive features 134 may be formed through any acceptable process, such as, a damascene process, a dual damascene process, or the like.

In some embodiments, the conductive features 134 may be formed using a damascene process in which a respective dielectric layer 132 is patterned utilizing a combination of photolithography and etching techniques to form trenches corresponding to the desired pattern of the conductive features 134. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive features 134 may be formed by depositing a seed layer of copper or a copper alloy, and filling the trenches by electroplating. A chemical mechanical planarization (CMP) process or the like may be used to remove excess conductive material from a surface of the respective dielectric layer 132 and to planarize surfaces of the dielectric layer 132 and the conductive features 134 for subsequent processing.

FIGS. 24A through 24C illustrate five layers of the conductive features 134 and the dielectric layers 132 in the front-side interconnect structure 130. However, it should be appreciated that the front-side interconnect structure 130 may comprise any number of conductive features 134 disposed in any number of dielectric layers 132. The front-side interconnect structure 130 may be electrically connected to the first source/drain contacts 126, the second source/drain contacts 128, and the gate contacts 129 to form functional circuits. In some embodiments, the functional circuits formed by the front-side interconnect structure 130 may comprise logic circuits, memory circuits, image sensor circuits, or the like.

Figures 25A, 25B:
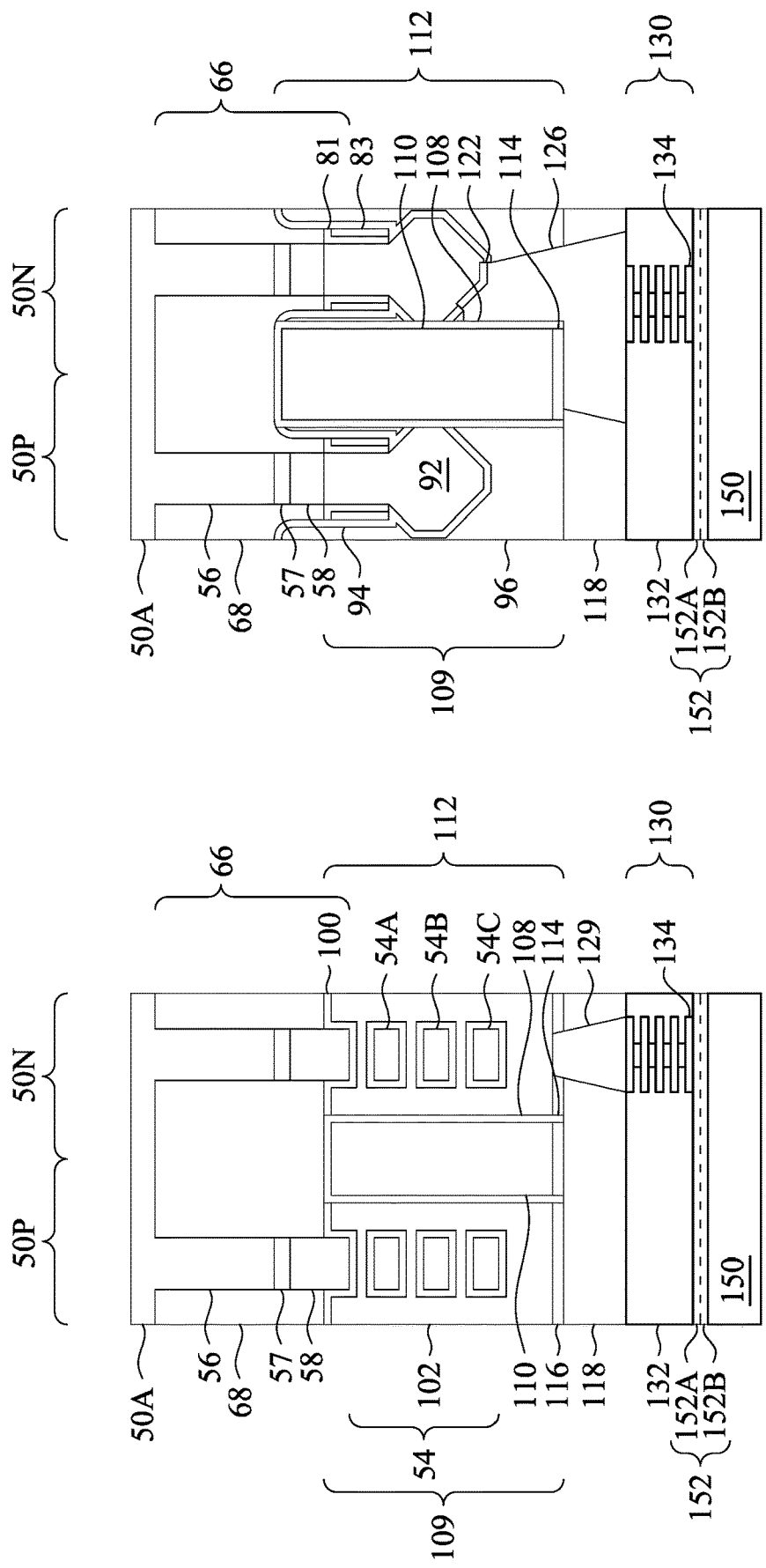
Figure 25C:
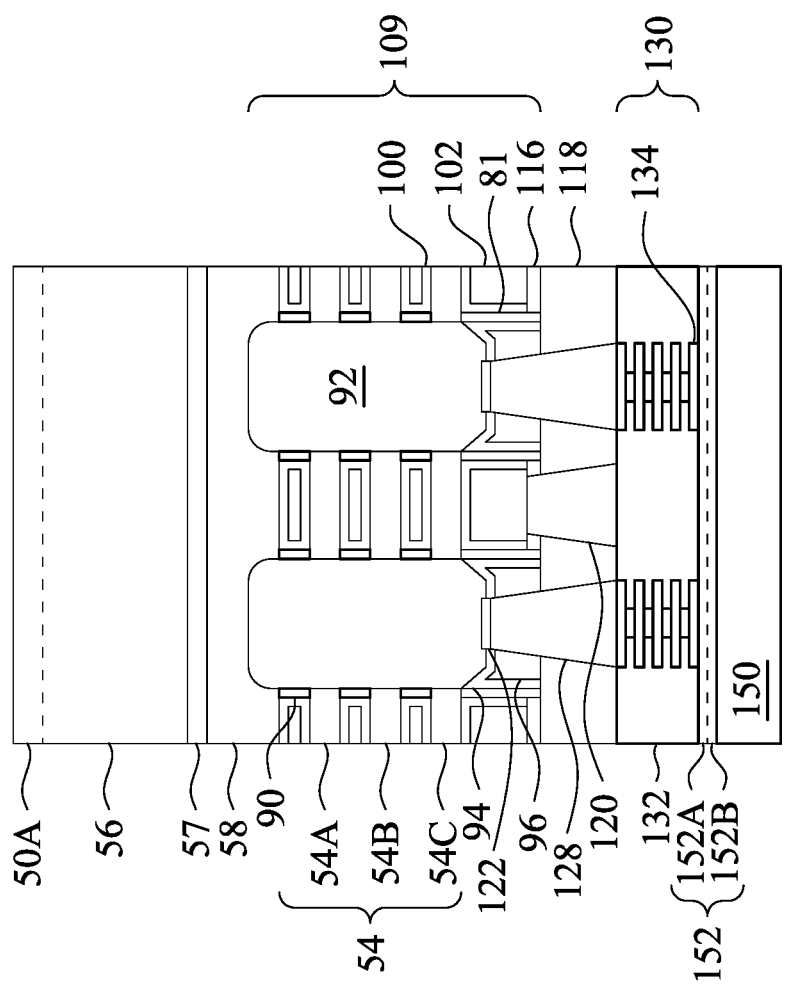

In FIGS. 25A through 25C, a carrier substrate 150 is bonded to a top surface of the front-side interconnect structure 130 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 130 using a suitable technique, such as dielectric-to-dielectric bonding, or the like. The dielectric-to-dielectric bonding may comprise depositing the first bonding layer 152A on the front-side interconnect structure 130. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 130 and the two are pressed against each other to initiate a pre-bonding of the carrier substrate 150 to the front-side interconnect structure 130. The pre-bonding may be performed at room temperature (e.g., between about 21° C. and about 25° C.). After the pre-bonding, an annealing process may be applied by, for example, heating the front-side interconnect structure 130 and the carrier substrate 150 to a temperature of about 170° C.

Further in FIGS. 25A through 25C, after the carrier substrate 150 is bonded to the front-side interconnect structure 130, the device may be flipped such that a backside of the transistor structures 109 faces upwards. The backside of the transistor structures 109 may refer to a side opposite to the front-side of the transistor structures 109 on which the active devices are formed.

Figures 26A, 26B:
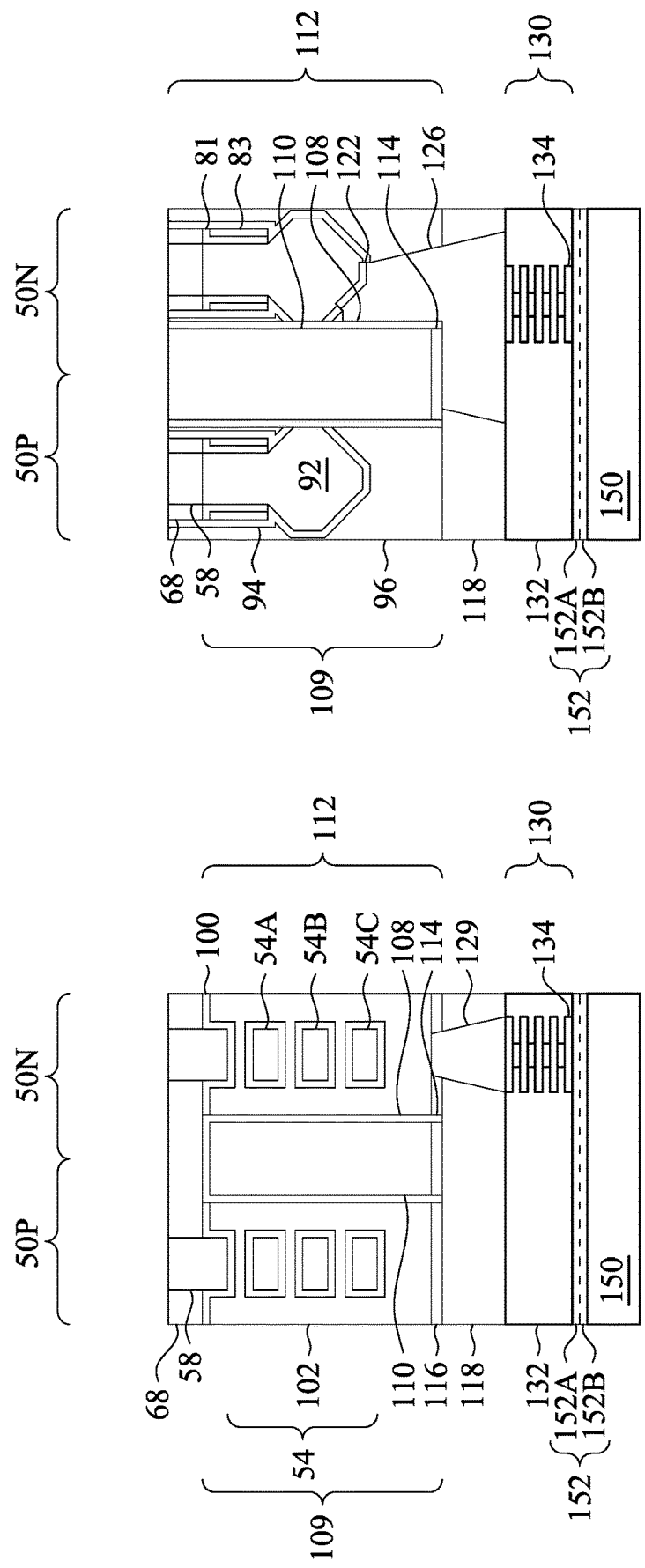
Figure 26C:
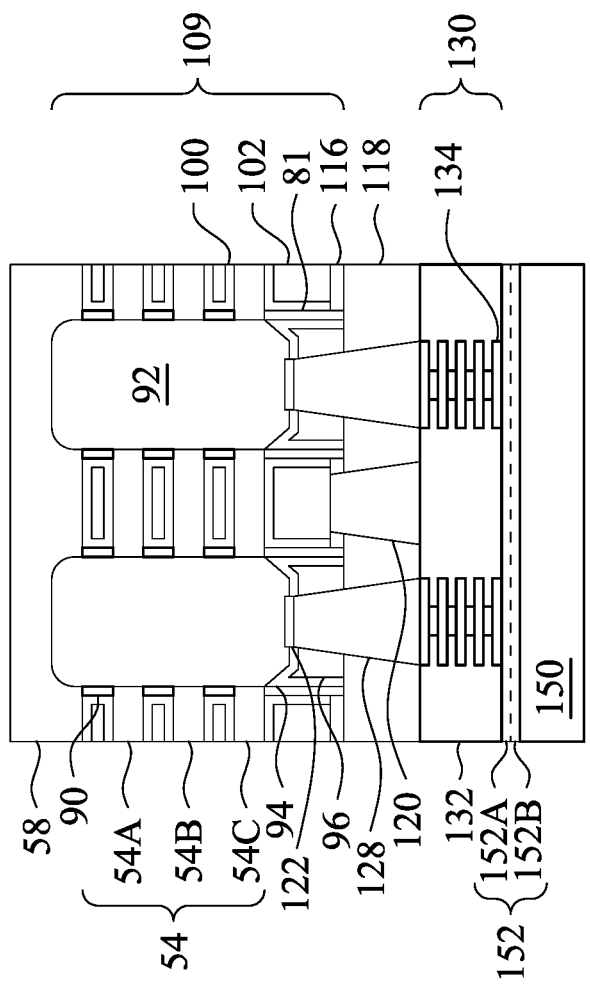

In FIGS. 26A through 26C, a thinning process is applied to the backside of the core substrate 50A. The thinning process may comprise a planarization process (e.g., a mechanical grinding, a CMP, or the like), an etch-back process, a combination thereof, or the like. The thinning process may remove the core substrate 50A, the lower fin portions 56, the middle fin portions 57, and portions of the STI regions 68, and may expose surfaces of the upper fin portions 58 and the backside power vias 112 opposite the front-side interconnect structure 130. As illustrated in FIGS. 26A through 26C, backside surfaces of the upper fin portions 58, the STI regions 68, the backside power vias 112, the CESL 94, and the first ILD 96 may be level with one another following the thinning process.

Figures 27A, 27B:
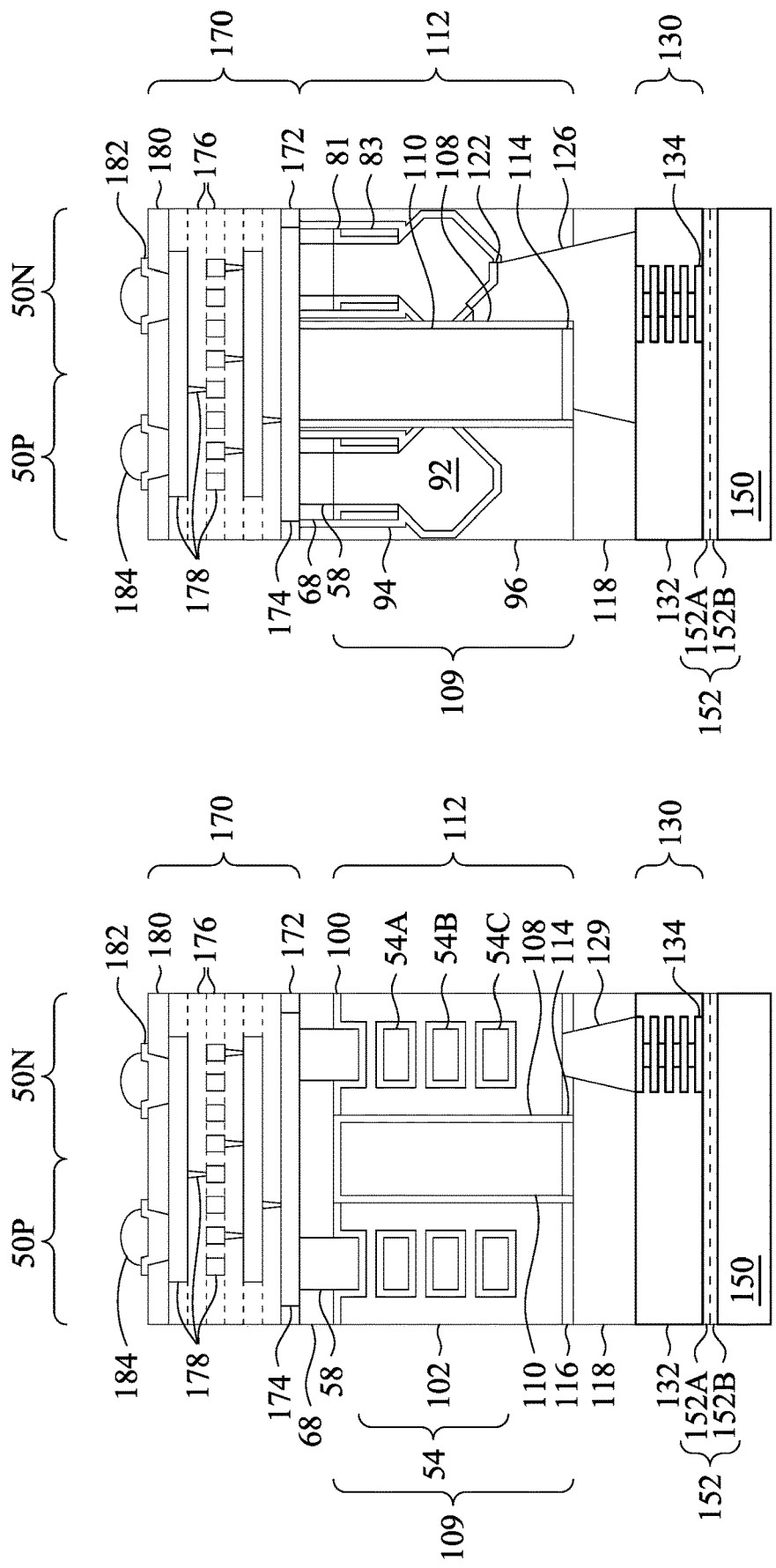
Figure 27C:
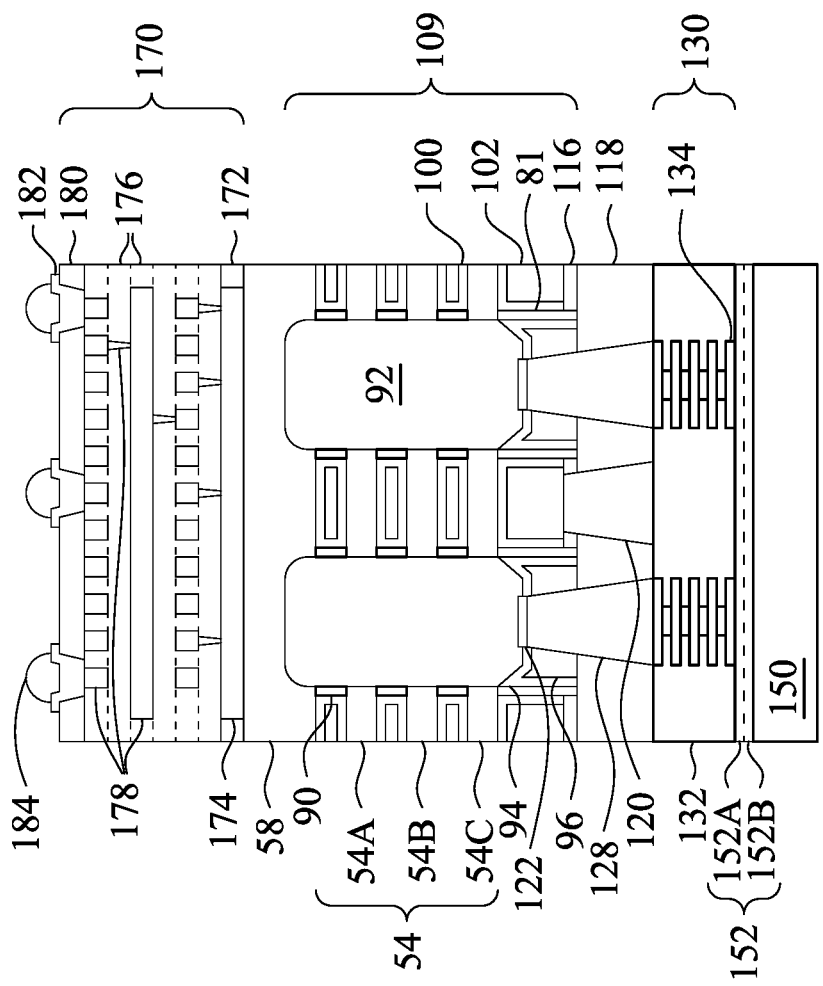

In FIGS. 27A through 27C, a backside interconnect structure 170 is formed on the upper fin portions 58, the STI regions 68, the backside power vias 112, the CESL 94, and the first ILD 96. The backside interconnect structure 170 may be referred to as a backside interconnect structure because it is formed on a backside of the transistor structures 109 (e.g., a side of the transistor structures 109 opposite the side of the transistor structure 109 on which active devices are formed). The backside interconnect structure 170 includes a dielectric layer 172, dielectric layers 176, a passivation layer 180, conductive lines 174, conductive features 178, UBMs 182, and external connectors 184. The conductive lines 174 and the dielectric layer 172 are formed on the upper fin portions 58, the STI regions 68, the backside power vias 112, the CESL 94, and the first ILD 96. The dielectric layer 172 may be formed by processes and from materials the same as or similar to the dielectric layer 132.

The conductive lines 174 are formed in the dielectric layer 172. Forming the conductive lines 174 may include patterning recesses in the dielectric layer 172 using a combination of photolithography and etching processes, for example. A pattern of the recesses in the dielectric layer 172 may correspond to a pattern of the conductive lines 174. The conductive lines 174 are then formed by depositing a conductive material in the recesses. In some embodiments, the conductive lines 174 comprise a metal layer, which may be a single layer or a composite layer comprising a plurality of sub-layers formed of different materials. In some embodiments, the conductive lines 174 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 174 may be formed using, for example, CVD, ALD, PVD, plating or the like. The conductive lines 174 are electrically coupled to the epitaxial source/drain regions 92 through the backside power vias 112 and the first source/drain contacts 126. A planarization process (e.g., a CMP, a grinding, an etch-back, or the like) may be performed to remove excess portions of the conductive lines 174 formed over the dielectric layer 172.

In some embodiments, the conductive lines 174 are power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nanostructure FETs and/or an interconnect density of the front-side interconnect structure 130 may be increased. Further, the backside of the semiconductor die may accommodate wider power rails, reducing resistance and increasing efficiency of power delivery to the nanostructure FETs. For example, a width of the conductive lines 174 may be at least twice a width of first level conductive lines (e.g., the conductive features 134) of the front-side interconnect structure 130.

The backside interconnect structure 170 includes conductive features and dielectric layers similar to the front-side interconnect structure 130. For example, the backside interconnect structure 170 may include conductive features and dielectric layers formed of materials and by processes the same as or similar to those of the front-side interconnect structure 130. The backside interconnect structure 170 may include stacked layers of conductive features 178 formed in stacked dielectric layers 176. The conductive features 178 may include conductive lines (e.g., for routing to and from subsequently formed contact pads and conductive connectors, such as the UBMs 182 and the external connectors 184). The conductive features 178 may include conductive vias that extend in the dielectric layers 176 to provide vertical interconnection between stacked layers of the conductive lines. The conductive features 178 may include one or more embedded passive devices, such as resistors, capacitors, inductors, or the like. The embedded passive devices may be integrated with the conductive lines 174 (e.g., the power rail) to provide circuits (e.g., power circuits) on the backside of the nanostructure FETs.

The passivation layer 180, the UBMs 182, and the external connectors 184 are formed on the dielectric layers 176 and the conductive features 178. The passivation layer 180 may comprise polymers such as PBO, polyimide, BCB, or the like. In some embodiments, the passivation layer 180 may include non-organic dielectric materials such as silicon oxide, silicon nitride, silicon carbide, silicon oxynitride, or the like. The passivation layer 180 may be deposited by, for example, CVD, PVD, ALD, or the like.

The UBMs 182 are formed through the passivation layer 180 to the conductive features 178, and external connectors 184 are formed on the UBMs 182. The UBMs 182 may comprise one or more layers of copper, nickel, gold, or the like, which are formed by a plating process, or the like. The external connectors 184 (e.g., solder balls) are formed on the UBMs 182. The formation of the external connectors 184 may include placing solder balls on exposed portions of the UBMs 182 and reflowing the solder balls. In some embodiments, the formation of the external connectors 184 includes performing a plating step to form solder regions on the topmost conductive features 178 and then reflowing the solder regions. The UBMs 182 and the external connectors 184 may be used to provide input/output connections to other electrical components, such as, other device dies, redistribution structures, printed circuit boards (PCBs), motherboards, or the like. The UBMs 182 and the external connectors 184 may also be referred to as backside input/output pads that may provide signal, supply voltage, and/or ground connections to the nanostructure FETs described above.

The materials and processes that have been described as being used for the liner layer 108 and the conductive fill material 110 of the backside power vias 112 may be used for any of the first source/drain contacts 126, the second source/drain contacts 128, the gate contacts 129, the conductive features 134, the conductive lines 174 and/or the conductive features 178. Incorporating the materials and processes used to form the backside power vias 112 into other features, such as the first source/drain contacts 126, the second source/drain contacts 128, the gate contacts 129, the conductive features 134, the conductive lines 174 and/or the conductive features 178 may provide similar improvements to those described with respect to the backside power vias 112, such as reduced leakage, reduced capacitance, reduced electrical resistance, improved RC delay, improved metal diffusion barriers, reduced feature size, improved thermal dissipation.

Embodiments may achieve advantages. For example, forming the backside power vias 112 including the liner layer 108, which is formed from a boron nitride material, allows for the liner layer 108 to act as both a diffusion barrier layer and an electrical insulation layer. This reduces feature sizes of the backside power vias 112, reduces process steps used to form the backside power vias 112, reduces device defects, and reduces costs. The liner layer 108 may provide improved breakdown voltage, reduced leakage, and reduced capacitance. In some embodiments, the liner layer 108 may also provide improved heat dissipation. Forming the liner layer 108 of the prescribed materials allows for greater flexibility in the choice of materials that may be used for the conductive fill material 110. For example, the conductive fill material 110 may be formed of a material such as copper, which has good electrical conductivity. This reduces electrical resistance in the backside power vias 112 and increases device performance.

In accordance with an embodiment, a semiconductor device includes a conductive feature adjacent a gate structure; a dielectric layer on the conductive feature and the gate structure; a metal via embedded in the dielectric layer; and a liner layer between and in contact with the metal via and the dielectric layer, the liner layer being boron nitride. In an embodiment, the liner layer includes amorphous boron nitride. In an embodiment, the liner layer includes hexagonal boron nitride. In an embodiment, the metal via includes copper. In an embodiment, the liner layer is between and in contact with the metal via and the gate structure. In an embodiment, the semiconductor device further includes a source/drain contact electrically coupled to the conductive feature and the metal via. In an embodiment, the semiconductor device further includes a cap layer on the metal via and extending between opposite sidewalls of the liner layer, the cap layer including tantalum nitride.

In accordance with another embodiment, a device includes a transistor structure including a source/drain region adjacent a gate structure; and a via electrically coupled to the source/drain region, the via extending through the gate structure, the via including a liner layer in physical contact with the gate structure, and the liner layer including boron nitride. In an embodiment, the liner layer is selected from amorphous boron nitride or hexagonal boron nitride. In an embodiment, the liner layer is in physical contact with a gate electrode and a gate dielectric layer of the gate structure. In an embodiment, a top surface of the via is level with a top surface of the gate structure. In an embodiment, the semiconductor device further includes a source/drain contact electrically coupling the source/drain region to the via. In an embodiment, the semiconductor device further includes a first interconnect structure on a front-side of the transistor structure; and a second interconnect structure on a backside of the transistor structure opposite the first interconnect structure, the second interconnect structure including a backside power rail electrically coupled to the source/drain region through the via and the source/drain contact. In an embodiment, the via extends through an inter-layer dielectric layer, and the liner layer is in physical contact with the inter-layer dielectric layer.

In accordance with yet another embodiment, a method includes providing a transistor structure on a substrate; forming a dielectric layer on the transistor structure; etching through the dielectric layer to form a recess; and forming a via in the recess, forming the via including depositing a liner layer in the first recess and lining side surfaces of the dielectric layer, precursors for the liner layer including a boron-containing precursor and a nitrogen-containing precursor; and depositing a conductive fill material on the liner layer, the conductive fill material filling the recess. In an embodiment, etching through the dielectric layer to form the recess etches through a gate structure of the transistor structure. In an embodiment, the boron-containing precursor is selected from ammonia borane (BNH6), borazine (B3N3H6), and borane (BH3), and the nitrogen-containing precursor is selected from nitrogen (N2) and ammonia (NH3). In an embodiment, the method further includes forming a source/drain contact on and electrically coupled to a source/drain region of the transistor structure and the via. In an embodiment, the method further includes thinning the substrate to expose the conductive fill material. In an embodiment, the liner layer is deposited as amorphous boron nitride, the method further includes performing a treatment on the liner layer to convert the material of the liner layer from amorphous boron nitride to hexagonal boron nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a conductive feature adjacent a gate structure;
   a dielectric layer on the conductive feature and the gate structure;
   a metal via embedded in the dielectric layer; and
   a liner layer between and in contact with the metal via and the dielectric layer, wherein the liner layer completely separates the metal via from the dielectric layer, wherein the liner layer is boron nitride.

2. The semiconductor device of claim 1, wherein the liner layer comprises amorphous boron nitride.

3. The semiconductor device of claim 1, wherein the liner layer comprises hexagonal boron nitride.

4. The semiconductor device of claim 1, wherein the metal via comprises copper.

5. The semiconductor device of claim 1, wherein the liner layer is between and in contact with the metal via and the gate structure.

6. The semiconductor device of claim 1, further comprising a source/drain contact electrically coupled to the conductive feature and the metal via.

7. The semiconductor device of claim 1, further comprising a cap layer on the metal via and extending between opposite sidewalls of the liner layer, wherein the cap layer comprises tantalum nitride.

8. The semiconductor device of claim 1, further comprising:
   a first interconnect structure on a front-side of the gate structure; and
   a second interconnect structure on a backside of the gate structure opposite the first interconnect structure, the second interconnect structure comprising a backside power rail electrically coupled to the conductive feature through the metal via.

9. The semiconductor device of claim 1, wherein the gate structure includes a gate dielectric layer and a gate electrode, wherein the liner layer is in physical contact with the gate electrode and the gate dielectric layer of the gate structure.

10. A device comprising:
    a transistor structure comprising a source/drain region adjacent a gate structure, wherein the gate structure comprises a gate electrode and a gate dielectric layer; and
    a via electrically coupled to the source/drain region, wherein the via extends through the gate structure, wherein the via comprises a liner layer, wherein the liner layer is in physical contact with the gate electrode and the gate dielectric layer of the gate structure, and wherein the liner layer comprises boron nitride.

11. The device of claim 10, wherein the liner layer is amorphous boron nitride or hexagonal boron nitride.

12. The device of claim 10, wherein a top surface of the via is level with a top surface of the gate structure.

13. The device of claim 10, further comprising a source/drain contact electrically coupling the source/drain region to the via.

14. The device of claim 13, further comprising:
    a first interconnect structure on a front-side of the transistor structure; and
    a second interconnect structure on a backside of the transistor structure opposite the first interconnect structure, the second interconnect structure comprising a backside power rail electrically coupled to the source/drain region through the via and the source/drain contact.

15. The device of claim 10, wherein the via extends through an inter-layer dielectric layer, and wherein the liner layer is in physical contact with the inter-layer dielectric layer.

16. A method comprising:
    providing a transistor structure on a substrate;
    forming a dielectric layer on the transistor structure;
    etching through the dielectric layer to form a recess; and
    forming a via in the recess, wherein forming the via comprises:
       depositing a liner layer in the recess and lining side surfaces of the dielectric layer, wherein precursors for the liner layer comprise a boron-containing precursor and a nitrogen-containing precursor, wherein the liner layer is deposited as amorphous boron nitride;
       performing a treatment on the liner layer to convert a material of the liner layer from amorphous boron nitride to hexagonal boron nitride; and depositing a conductive fill material on the liner layer, the conductive fill material filling the recess.

17. The method of claim 16, wherein etching through the dielectric layer to form the recess etches through a gate structure of the transistor structure.

18. The method of claim 16, wherein the boron-containing precursor is selected from ammonia borane ($BNH_6$), borazine ($B_3N_3H_6$), and borane ($BH_3$), and wherein the nitrogen-containing precursor is selected from nitrogen ($N_2$) and ammonia ($NH_3$).

19. The method of claim 16, further comprising forming a source/drain contact on and electrically coupled to a source/drain region of the transistor structure and the via.

20. The method of claim 16, further comprising thinning the substrate to expose the conductive fill material.

* * * * *